(12) United States Patent
Kim et al.

(10) Patent No.: US 10,886,348 B2
(45) Date of Patent: Jan. 5, 2021

(54) DISPLAY DEVICE

(71) Applicant: Samsung Display Co., Ltd., Yongin-si (KR)

(72) Inventors: Byoung Yong Kim, Seoul (KR); Jeong Ho Hwang, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/408,009

(22) Filed: May 9, 2019

(65) Prior Publication Data

US 2019/0348487 A1 Nov. 14, 2019

(30) Foreign Application Priority Data

May 10, 2018 (KR) .................. 10-2018-0053673

(51) Int. Cl.
*H01L 27/32* (2006.01)
*H01L 51/52* (2006.01)
*H01L 23/00* (2006.01)

(52) U.S. Cl.
CPC .......... *H01L 27/3258* (2013.01); *H01L 24/81* (2013.01); *H01L 27/3276* (2013.01); *H01L 51/5203* (2013.01); *H01L 51/5237* (2013.01); *H01L 2224/81205* (2013.01)

(58) Field of Classification Search
None
See application file for complete search history.

(56) References Cited

U.S. PATENT DOCUMENTS

| | | | |
|---|---|---|---|
| 9,640,598 B2 | 5/2017 | Park et al. | |
| 2015/0108452 A1* | 4/2015 | Park | H01L 27/3276 257/40 |
| 2016/0370674 A1* | 12/2016 | Koo | G02F 1/13452 |
| 2017/0358642 A1* | 12/2017 | Jo | H01L 25/18 |
| 2017/0365653 A1* | 12/2017 | Kim | G02F 1/13458 |
| 2018/0011369 A1* | 1/2018 | An | G02F 1/167 |
| 2018/0046012 A1* | 2/2018 | Miyamoto | G02F 1/133345 |
| 2018/0061895 A1* | 3/2018 | Kim | H01L 27/3246 |
| 2018/0212009 A1* | 7/2018 | Odaka | H01L 51/5246 |
| 2019/0137808 A1* | 5/2019 | Koide | G02F 1/13452 |

FOREIGN PATENT DOCUMENTS

| | | |
|---|---|---|
| KR | 10-2015-0045330 | 4/2015 |
| KR | 10-2018-0000046 | 1/2018 |

* cited by examiner

*Primary Examiner* — Shaun M Campbell
(74) *Attorney, Agent, or Firm* — H.C. Park & Associates, PLC

(57) ABSTRACT

A display device including a display area and a non-display area disposed around the display area. The device includes a substrate; and at least one pad terminal disposed in the non-display area on the substrate and including an uneven surface in which concave portions and convex portion are electrically connected to each other.

19 Claims, 26 Drawing Sheets

DISPLAY DEVICE

CROSS REFERENCE TO RELATED APPLICATION

This application claims priority from and the benefit of Korean Patent Application No. 10-2018-0053673, filed on May 10, 2018, which is hereby incorporated by reference for all purposes as if fully set forth herein.

BACKGROUND

Field

Exemplary embodiments of the invention relate generally to a display device, and more specifically, to a display device provided with a driving member.

Discussion of the Background

A display device is a device for visually displaying data. Such a display device includes a substrate partitioned into a display area and a non-display area. A pixel is disposed on the substrate in the display area, and a pad or the like is disposed on the substrate in the non-display area. The pad is provided with a driving circuit to transmit a driving signal to the pixel.

Meanwhile, the driving circuit may include a plurality of bumps, and each of the bumps may be bonded to the pads separated from each other. When the driving circuit is connected to the pads, stress is applied. Therefore, when uniform stress is not applied to the pads, poor bonding may occur.

The above information disclosed in this Background section is only for understanding of the background of the inventive concepts, and, therefore, it may contain information that does not constitute prior art.

SUMMARY

Exemplary embodiments of the inventive concepts provide a display device with reliable bonds between a pad terminal and a driving member.

Additional features of the inventive concepts will be set forth in the description which follows, and in part will be apparent from the description, or may be learned by practice of the inventive concepts.

According to one or more exemplary embodiments of the invention, a display device, includes a display area and a non-display area disposed around the display area. The device includes: a substrate; and at least one pad terminal disposed in the non-display area on the substrate and including an uneven surface in which concave portions and convex portion are electrically connected to each other.

In an exemplary embodiment, the pad terminal may include a first conductive pattern and a second conductive pattern disposed on the first conductive pattern and electrically connected to the first conductive pattern, and the second conductive pattern extends outward from a side surface of the first conductive pattern.

In an exemplary embodiment, the pad terminal may include a first region where the second conductive pattern overlaps the first conductive pattern in a thickness direction and a second region where the second conductive pattern does not overlap the first conductive pattern, and an upper surface of the second conductive pattern in the first region protrudes in the thickness direction as compared with an upper surface of the second conductive pattern in the second region.

In an exemplary embodiment, the pad terminal may further include a third conductive pattern disposed under the first conductive pattern.

In an exemplary embodiment, the third conductive pattern may extend outward from a side surface of the first conductive pattern, and the third conductive pattern is in contact with the first conductive pattern in the first region.

In an exemplary embodiment, the third conductive pattern may be in contact with the second conductive pattern in the second region.

In an exemplary embodiment, the pad terminal may include a region where the second conductive pattern overlaps the first conductive pattern in a thickness direction and a second region where the second conductive pattern does not overlap the first conductive pattern, and an upper surface of the second conductive pattern in the first region forms the convex portions of the uneven surface, and an upper surface of the second conductive pattern in the second region forms the concave portions of the uneven surface.

In an exemplary embodiment, the second conductive pattern may be in contact with both upper surface and side surface of the first conductive pattern.

In an exemplary embodiment, the plurality of first conductive patterns may be provided, the plurality of first conductive patterns are spaced apart from each other, and the second conductive pattern covers the plurality of first conductive patterns.

In an exemplary embodiment, the pad terminal may include a first conductive pattern, an insulating pattern disposed on the first conductive pattern and including an opening partially exposing the first conductive pattern, and a second conductive pattern disposed on the insulating pattern and being in contact with the first conductive pattern through the opening.

In an exemplary embodiment, the pad terminal may include a first region where the second conductive pattern overlaps the insulating pattern in a thickness direction and a second region where the second conductive pattern does not overlap the insulation pattern in the thickness direction, and an upper surface of the second conductive pattern in the first region protrudes in the thickness direction as compared with an upper surface of the second conductive pattern in the second region.

In an exemplary embodiment, the display device may further include a driving member attached to the non-display area of the substrate, wherein the driving member includes a bump electrically connected to the pad terminal.

In an exemplary embodiment, the pad terminal and the bump may be in direct contact with each other.

In an exemplary embodiment, the pad terminal and the bump may be ultrasonically bonded to each other.

In an exemplary embodiment, the display device may further include a signal wiring disposed over the non-display area and the display area and connected to the pad terminal.

In an exemplary embodiment, the display area may include a plurality of pixels, each of the pixels includes at least one thin film transistor, and the signal wiring is electrically connected to the thin film transistor.

According to another exemplary embodiment of the present disclosure, a display device includes a display area including a thin film transistor and a non-display area disposed around the display area and including a pad area. The device includes: a substrate; a first conductive layer on the substrate; a first insulating layer on the first conductive layer; a second conductive layer on the first insulating layer; a second insulating layer on the second conductive layer; a third conductive layer on the second insulating layer, wherein the first conductive layer includes a gate electrode of the thin film transistor of the display area and a first pad electrode disposed in the pad area, the second conductive layer includes a second pad electrode disposed in the pad area, and the third conductive layer includes source/drain electrodes of the thin film transistor of the display area and a third pad electrode disposed in the pad area, wherein the first pad electrode, the second pad electrode, and the third pad electrode overlap each other in a thickness direction to be electrically connected to each other, and the third pad electrode includes an uneven surface.

In an exemplary embodiment, the second pad electrode may be smaller than the first pad electrode and the third pad electrode.

In an exemplary embodiment, the display device may further include a driving member attached to the non-display area of the substrate, wherein the driving member includes a bump being in contact with the uneven surface of the third pad electrode.

In an exemplary embodiment, the third pad electrode and the bump may be ultrasonically bonded to each other.

Aspects of the present invention are to provide a display device capable of improving the bonding reliability of pads.

However, aspects of the present invention are not restricted to the one set forth herein. The above and other aspects of the present invention will become more apparent to one of ordinary skill in the art to which the present invention pertains by referencing the detailed description of the present invention given below.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
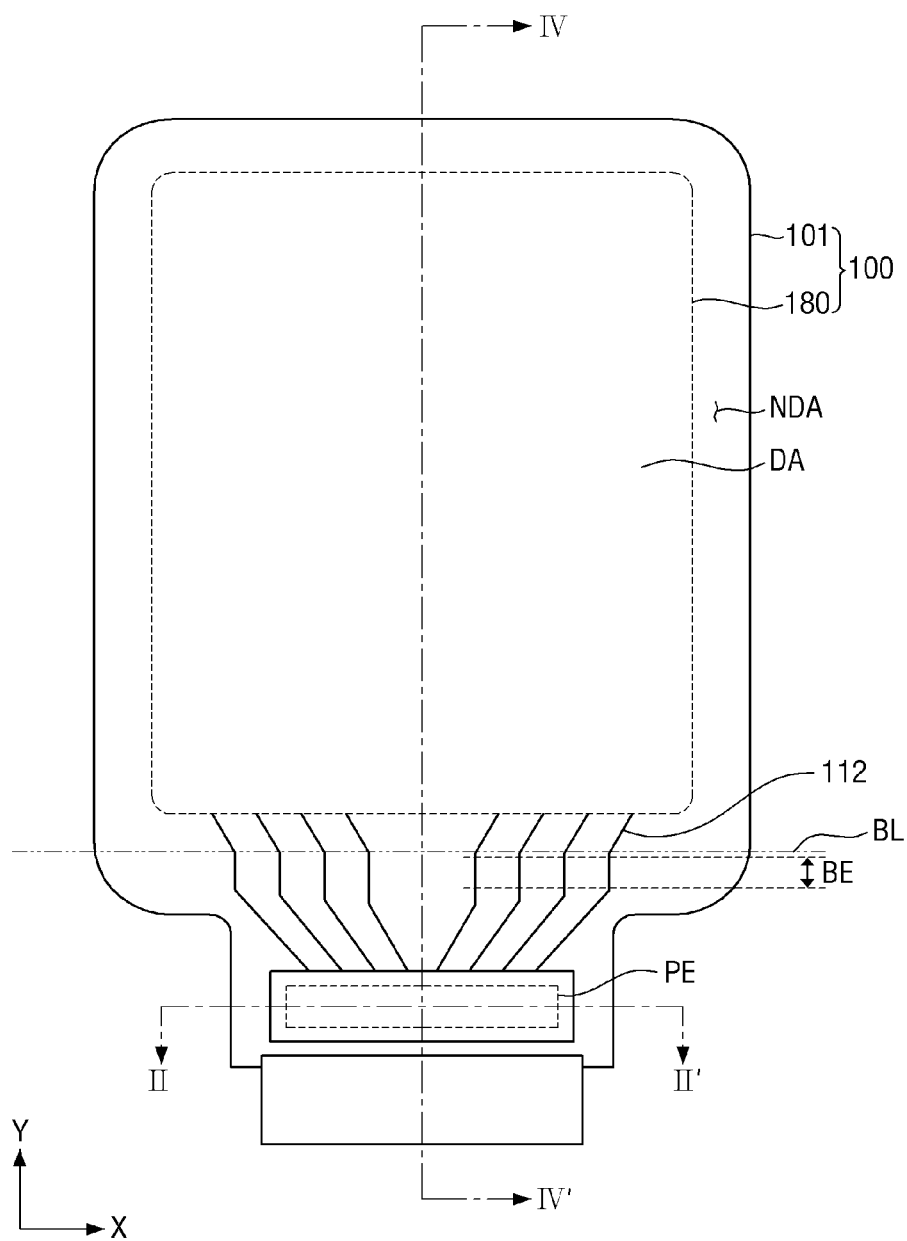
FIG. 1 is a plan view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of circuits. Such circuits, such as logic circuits, discrete components, microprocessors, hard-wired circuits, memory elements, wiring connections, and the like, generally refer to well-known driving circuitry and chips may be formed using semiconductor-based fabrication techniques or other manufacturing technologies. In the case of the circuits being implemented by microprocessors or other similar hardware, they may be programmed and controlled using software (e.g., microcode) to perform various functions discussed herein and may optionally be driven by firmware and/or software. It is also contemplated that each circuit may be implemented by dedicated hardware, or as a combination of dedicated hardware to perform some functions and a processor (e.g., one or more programmed microprocessors and associated circuitry) to perform other functions. Also, each circuit of some exemplary embodiments may be physically separated into two or more interacting and discrete blocks, units, and/or modules without departing from the scope of the inventive concepts. Further, the blocks, units, and/or modules of some exemplary embodiments may be physically combined into more complex circuits without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a display device according to an exemplary embodiment.

Referring to FIG. 1, a display device 1 according to the present exemplary embodiment includes a display area DA displaying an image and a non-display area NDA disposed around the display area DA. The display device 1 may have a rectangular shape having vertical corners or a rectangular shape having rounded corners in a plan view. The planar shape of the display area DA is not limited thereto, and the display area DA may have a circular shape, an elliptical shape, or other various shapes.

The display device 1 may include a display panel 100 for displaying a screen and a driving member 260 attached to the display panel 100 to drive a pixel circuit of the display panel 100.

The display panel 100 may be, for example, an organic light emitting display panel. In the following exemplary embodiments, a case where an organic light emitting display panel is applied as the display panel 100 is exemplified, but the present invention is not limited thereto. Different kinds of display panels, such as a liquid crystal display (LCD) panel, a field emission display (FED) panel, and an electrophoretic display panel may be applied as the display panel 100.

The display panel 100 includes a plurality of pixels arranged in the display area DA. Further, the display panel 100 may include a pad area PA disposed in the non-display area NDA. The pad area PA may be located in the non-display area NDA surrounding the display area DA along one side of the display area DA. For example, as shown in FIG. 1, the pad area PA may be disposed adjacent to the lower side of the display area DA. The width of the non-display area NDA (lower side of the display area in the drawing) where the pad area PA is greater than the width of the non-display area NDA where the pad area PA is not located (upper, left, and right sides of the display area in the drawing).

In some exemplary embodiments, the display panel 100 may further include a bending area BA. The bending area BA may be disposed between an array of pixels and the pad area PA. The bending area BA may be located in the non-display area NDA. The display panel 100 may be folded in one direction about a bending line BL which is a reference line disposed in the bending area BA. The bending line BL may be a straight line parallel to the lower side (or upper side) of the display panel 100. However, the present invention is not limited thereto, and the display area DA and the pad area PA may be connected to each other without the bending area BA. That is, in the display panel 100, the entire display area DA and non-display area NDA may be flat without the bending area BA.

Figure 2:
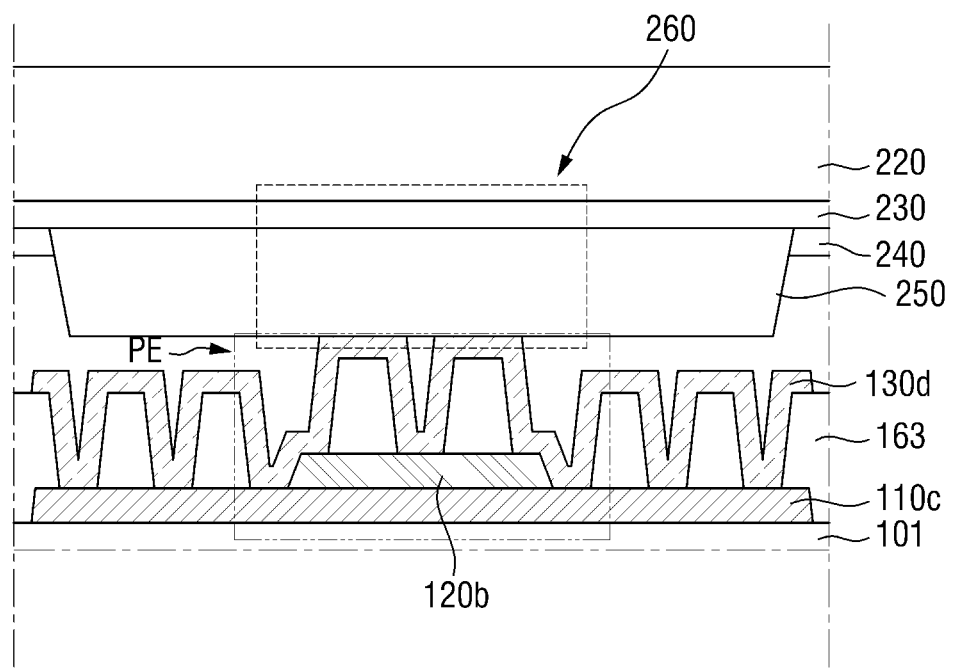
FIG. 2 is a cross-sectional view taken along the line II-II' in FIG. 2.

The pad area PA of the non-display area NDA may include a plurality of pad terminals (refer to 'PE' in FIG. 2). The plurality of pad terminals PE may be connected to wirings 112 extending from the display area DA. A driving member (refer to '260' in FIG. 2) may be attached to the plurality of pad terminals PE.

FIG. 2 is a cross-sectional view taken along the line II-II' in FIG. 2.

The driving member 260 will be described in more detail with reference to FIGS. 1 and 2. As shown in FIG. 2, the driving member 260 may be a driving chip. The driving chip may be, for example, a chip on plastic (COP) or a chip on glass (COG). The driving member 260 may include a printed circuit board. Hereinafter, a case where a driving chip is applied as the driving member 260 will be described as an example.

The driving member 260 may include a driving IC 220 including a circuit pattern 230, an insulating film 240, and a plurality of bumps 250 disposed under the driving IC 220. The insulating film 240 may cover a part of the circuit pattern 230. The circuit pattern 230 may be electrically connected to the bump 250. The bump 250 may be formed of one or more of gold (Au), nickel (Ni), and tin (Sn).

The driving member 260 may be attached to the pad area PA of the display panel 100. Specifically, the pad area PA of the display panel 100 is provided with a plurality of pad terminals PE, and the bumps 250 of the driving member 260 may be electrically connected to the respective pad terminals PE of the display panel 100. Details of the pad terminal PE of the display panel 100 will be described later.

In an exemplary embodiment, the bump 250 of the driving member 260 may be coupled to directly contact the pad terminal PE without intervening other layers or components. The direct coupling between the bump 250 of the driving member 260 and the pad terminal PE may be performed through ultrasonic bonding. Details thereof will be described with reference to FIG. 3.

Figure 3:
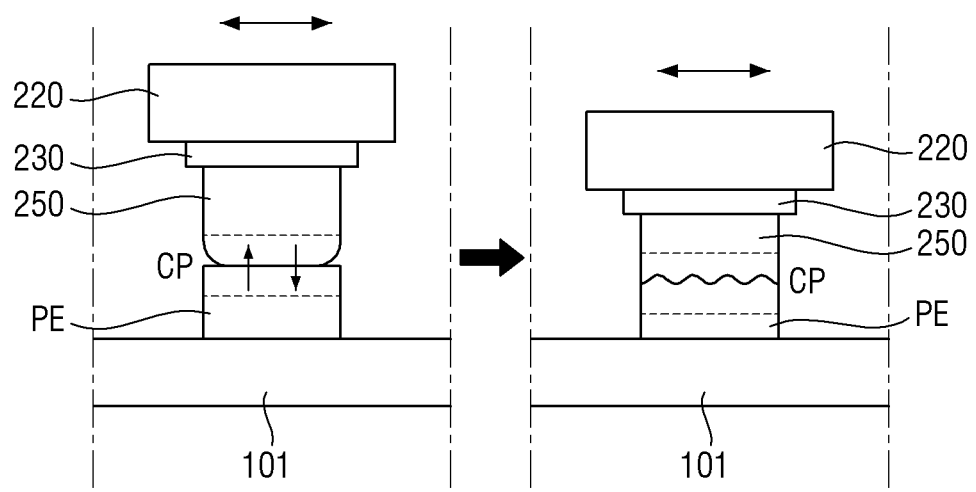
FIG. 3 shows cross-sectional views of a bonding step of the bonding portion of FIG. 2.

FIG. 3 shows cross-sectional views illustrating an ultrasonic bonding process according to an exemplary embodiment.

As shown in FIG. 3, when the bump 250 of the driving member 260 is placed on the pad terminal PE of the display panel 100 and ultrasonic processing is performed under a constant pressure, a frictional force is generated at an interface to allow the bump 250 and the pad terminal PE to be partially melted, and, at the same time, respective components may be diffused toward each other. Specifically, the components included in the bump 250 of the driving member 260 may be partially diffused into the pad terminal PE, and the components included in the pad terminal PE may be partially diffused into the bump 250 of the driving member 260. As a result, the pad terminal PE may have a region in which the components included in the bump 250 of the driving member 260 are diffused, and, at the same time, the bump 250 of the driving member 260 may have a region in which the components included in the pad terminal PE are diffused. As shown at the right side of FIG. 3, in the region in which the components included in the bump 250 are diffused and the region in which the components included in the pad terminal PE are diffused, the bump 250 and the pad terminal PE may be directly coupled to contact each other. The interface between the directly coupled bump 250 and pad terminal PE may have a non-flat shape through melting and solidification. Further, an alloy of different materials may be formed at the interface as the inter-diffusion of these components occurs.

Unlike that shown in the drawing, the bump 250 of the driving member 260 and the pad terminal PE may be attached to each other through an anisotropic conductive film.

Hereinafter, the cross-sectional structure of the display panel 100 will be described in more detail.

Figure 4:
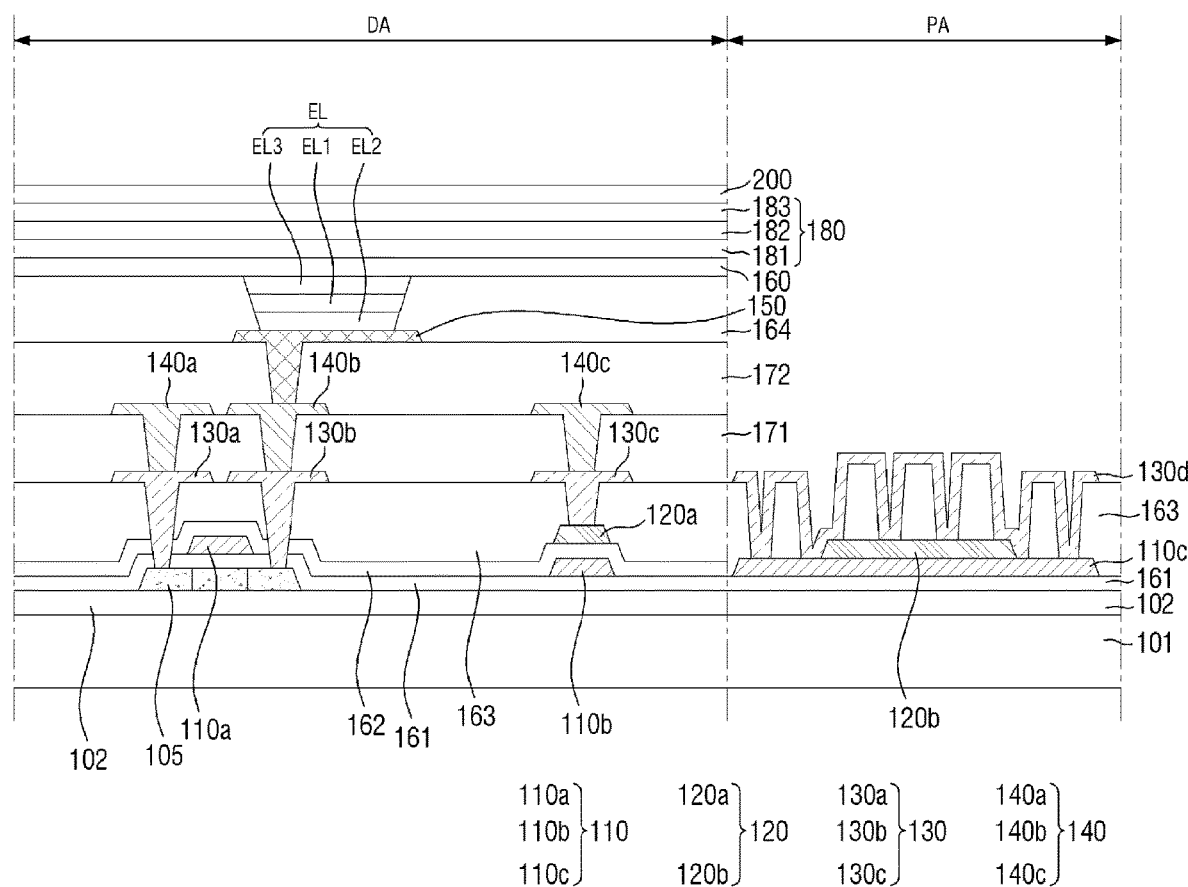
FIG. 4 is a cross-sectional view taken along the line IV-IV' in FIG. 1.

FIG. 4 is a cross-sectional view taken along the line IV-IV' in FIG. 1.

Referring to FIG. 4, the display panel 100 includes a base substrate 101, a plurality of conductive layers disposed on the base substrate 101, a plurality of insulating layers, and an organic light emitting layer.

More specifically, the base substrate 101 may support the respective layers disposed thereon. The base substrate 101 may be disposed over the display area DA and the non-display area NDA. The base substrate 101 may be made of an insulating material such as a polymer resin.

Examples of the polymer resin may include polyethersulphone (PES), polyacrylate (PA), polyarylate (PAR), polyetherimide (PEI), polyethylene napthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and combinations thereof. The base substrate 101 may be a flexible substrate capable of bending, folding, rolling, or the like. An example of the material of the flexible substrate is polyimide (PI), but is not limited thereto. The base substrate 101 may also be a rigid substrate made of glass, quartz, or the like.

A buffer layer 102 may be disposed on the base substrate 101. The buffer layer 102 may be disposed over the entire display area DA and non-display area NDA. The buffer layer 102 may prevent the diffusion of impurity ions, may prevent the penetration of moisture or external air, and may perform a surface planarization function. The buffer layer 102 may cover most of the display area DA and the non-display area NDA of the base substrate 101.

The buffer layer 102 may include silicon nitride, silicon oxide, or silicon oxynitride.

A semiconductor layer 105 may be disposed on the buffer layer 102. The semiconductor layer 105 forms a channel of a thin film transistor. The semiconductor layer 105 is disposed in each pixel of the display area DA, and may be disposed in the non-display area NDA in some cases. Although it is shown in the drawing that the semiconductor layer 105 is not disposed in the pad area PA of the non-display area NDA, in some cases, the semiconductor layer 105 may be disposed even in the pad area PA.

The semiconductor layer 105 may include a source region, a drain region, and an active region. The semiconductor layer 105 may include polycrystalline silicon. The polycrystalline silicon may be formed by crystallizing amorphous silicon. Examples of the crystallization may include, but are not limited to, rapid thermal annealing (RTA), solid phase crystallization (SPC), metal induced crystallization (MIC), metal induced lateral crystallization (MILC), and sequential lateral solidification (SLS). In the semiconductor layer 105, regions (source/drain region) connected to source/drain electrodes of a thin film transistor (TFT) may be doped with impurity ions (p-type impurity ions in the case of a PMOS transistor). A trivalent dopant such as boron (B) may be used as a p-type impurity ion. In another exemplary embodiment, the semiconductor layer 105 may include monocrystalline silicon, low-temperature polycrystalline silicon, amorphous silicon, or an oxide semiconductor. Examples of the oxide semiconductor may include a binary compound (ABx), a ternary compound (ABxCy), and a quartz-based compound (ABxCyDz), each of which contains two or more of indium, zinc, gallium, tin, titanium, aluminum, hafnium (Hf), zirconium (Zr), magnesium (Mg). The semiconductor layer 105 may include ITZO (an oxide including indium, tin, and titanium) or IGZO (an oxide including indium, gallium, and tin).

A first insulating layer 161 may be disposed on the semiconductor layer 105. The first insulating layer 161 may be formed over the entire surface of the base substrate 101 including the display area DA and the non-display area NDA.

The first insulating layer 161 may be a gate insulating film having a gate insulating function.

The first insulating layer 161 may include a silicon compound or a metal oxide. For example, the first insulating layer 161 may include silicon oxide, silicon nitride, silicon oxynitride, aluminum oxide, tantalum oxide, hafnium oxide, zirconium oxide, or titanium oxide. These may be used alone or in combination with each other. Although it is shown in the drawing that the first insulating layer 161 is formed of a single-layered film, in some cases, the first insulating layer 161 may be a multi-layered film made of a laminated film of different materials.

A first gate conductive layer 110 may be disposed on the first insulating layer 161. In an exemplary embodiment, the first gate conductive layer 110 may include a gate electrode 110a of a thin film transistor (TFT), a first electrode 110b of a storage capacitor Cst, and a first pad electrode 110c. The first gate conductive layer 110 may further include a scanning signal line for transmitting a scanning signal to the gate electrode 110a.

The gate electrode 110a of the thin film transistor (TFT), the first electrode 110b of the storage capacitor Cst, and the first pad electrode 110c may be formed of the same material under the same process. For example, the first gate conductive layer 110 may be formed of at least one metal selected from molybdenum (Mo), aluminum (Al), platinum (Pt), palladium (Pd), silver (Ag), magnesium (Mg), gold (Au), nickel (Ni), neodymium (Nd), iridium (Ir) And may include at least one metal selected from among chromium (Cr), calcium (Ca), titanium (Ti), tantalum (Ta), tungsten (W), and copper (Cu). Although it is shown in the drawing that the first gate conductive layer 110 is a single-layered film, in some cases, the first gate conductive layer 110 may be a multi-layered film. In this case, the multi-layered film of the first gate conductive layer 110 may be formed of a laminated film of different metals among the above-described metals.

A second insulating layer 162 may be disposed on the first gate conductive layer 110. The second insulating layer 162 may be disposed over the display area DA and the non-display area NDA, but may not be disposed in the pad area PA.

The second insulating layer 162 may isolate the first gate conductive layer 110 and the second gate conductive layer 120 from each other. The second insulating layer 162 may be an interlayer insulating film.

The second insulating layer 162 may include an inorganic insulating material such as silicon oxide, silicon nitride, silicon oxynitride, hafnium oxide, aluminum oxide, titanium oxide, tantalum oxide, zinc oxide, or may include an organic insulating material such as polyacrylate resin, epoxy resin, phenolic resin, polyamide resin, polyimide resin, unsaturated polyester resin, polyphenylene resin, polyphenylene sulfide resin, or benzocyclobutene (BCB). Although it is shown in the drawing that the second insulating layer 162 is a single-layered film, the present invention is not limited thereto, and the second insulating layer 162 may be a multi-layered film formed of a laminated film including different material from each other.

Although it is shown in the drawing that the second insulating layer 162 is not disposed in the pad area PA and exposes the first pad electrode 110c, the present invention is not limited thereto, and the second insulating layer 162 may be disposed to partially cover the first pad electrode 110c.

A second gate conductive layer 120 may be disposed on the second insulating layer 162. The second gate conductive layer 120 may include a second conductive electrode 120a of the storage capacitor Cst and a second pad electrode 120b. The second conductive electrode 120a of the storage capacitor Cst may overlap the first electrode 110b with the second insulating layer 162 interposed therebetween. That is, the first electrode 110b and the second conductive electrode 120a may form a storage capacitor Cst having the second insulating layer 162 as a dielectric film.

The second gate conductive layer 120 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir) And may include at least one metal selected from among chromium (Cr), calcium (Ca), titanium (Ti), tantalum (Ta), tungsten (W), and copper (Cu). In an exemplary embodiment, the second gate conductive layer 120 may be made of the same material as the aforementioned first gate conductive layer 110.

Although it is shown in the drawing that the second gate conductive layer 120 is a single-layered film, in some cases, the second gate conductive layer 120 may be a multi-layered film.

A second pad electrode 120b is disposed in the pad area PA. The second pad electrode 120b may be electrically connected to the first pad electrode 110c. The second pad electrode 120b may be disposed directly on the first pad electrode 110c.

The second pad electrode 120b may be smaller than the first pad electrode 110c. Accordingly, the first pad electrode 110c may include a region overlapping the second pad electrode 120b and a region not overlapping the second pad electrode 120b. The region where the second pad electrode 120b overlaps the first pad electrode 110c protrudes in the thickness direction by the thickness of the second pad electrode 120b as compared with the region where the second pad electrode 120b is not disposed, so that a step may be formed.

A third insulating layer 163 is disposed on the second gate conductive layer 120. The third insulating layer 163 may isolate the second gate conductive layer 120 from a first source/drain conductive layer 130.

The third insulating layer 163 may cover the second gate conductive layer 120 of the display area DA, and may partially cover the second pad electrode 120b and/or the first pad electrode 110c in the pad area PA of the non-display area NDA.

Specifically, the third insulating layer 163 on the pad area PA may include a plurality of openings partially exposing the second pad electrode 120b and/or the first pad electrode 110c. The openings may serve as a contact holes for electrically connecting the third pad electrode 130d, which will be described later, to the second pad electrode 120b and/or the first pad electrode 110c. Each of the openings may be formed in the shape of a hole in the third insulating layer 163, or may be defined between a plurality of island-shaped insulation patterns obtained by separating the third insulating layer 163. Details of the openings of the third insulating layer 163 will be described later.

The third insulating layer 163 may include an inorganic insulating material such as silicon oxide, silicon nitride, silicon oxynitride, hafnium oxide, aluminum oxide, titanium oxide, tantalum oxide, zinc oxide, or may include an organic insulating material such as polyacrylate resin, epoxy resin, phenolic resin, polyamide resin, polyimide resin, unsaturated polyester resin, polyphenylene resin, polyphenylene sulfide resin, or benzocyclobutene (BCB). Although it is shown in the drawing that the third insulating layer 163 is formed of a single-layered film, the present invention is not limited thereto, and the third insulating layer 163 may be formed of a multi-layered film.

A first source/drain conductive layer 130 may be disposed on the third insulating layer 163. In an exemplary embodiment, the first source/drain conductive layer 130 includes a source electrode (SE) 130a of a thin film transistor (TFT), a drain electrode (DE) 130b of the thin film transistor (TFT), a power supply voltage electrode 130c, and a third pad electrode 130d. The source electrode (SE) 130a and the drain electrode (DE) 130b of the thin film transistor TFT are electrically connected to the source region and the drain region of the semiconductor layer 105, respectively, through a contact hole penetrating the third insulating layer 163, the second insulating layer 162, and the first insulating layer 161.

The third pad electrode 130d is disposed in the pad area PA. The third pad electrode 130d may overlap the second pad electrode 120b and the first pad electrode 110c. The third pad electrode 130d is disposed on the third insulating layer 163 in the pad area PA, and may be electrically connected to the second pad electrode 120b and/or the first pad electrode 110c through the opening of the third insulating layer 163.

The third pad electrode 130d may be larger than the second pad electrode 120b. The size of the third pad electrode 130d may be substantially equal to the size of the first pad electrode 110c, but the present invention is not limited thereto.

Accordingly, the third pad electrode 130d may include a region overlapping the second pad electrode 120b and a region not overlapping the second pad electrode 120b. The region where the third pad electrode 130d overlaps the second pad electrode 120b protrudes in the thickness direction by the thickness of the second pad electrode 120b as compared with the region where the second pad electrode 120b is not disposed. In addition, the degree of protrusion of the third pad electrode 130d in the thickness direction may be changed depending on whether the underlying third insulating layer 163 is located. Thus, the upper surface of the third pad electrode 130d in one pad terminal PE includes concave portions and convex portion, and the concave portions and the convex portions are electrically connected to each other.

A first via layer 171 and other layers are stacked on the first source/drain conductive layer 130. The layers on the first source/drain conductive layer 130 are not disposed in the pad area PA of the non-display area DA, and thus the third pad electrode 130d may be exposed. The bump of the aforementioned driving member may be in contact with the upper surface of the exposed third pad electrode 130d.

The first source/drain conductive layer 130 may include at least one metal selected from aluminum (Al), platinum (Pt), palladium (Pd), silver (Ag), magnesium (Mg), gold (Au), nickel (Ni), neodymium (Nd), iridium (Ir) (Ca), titanium (Ti), tantalum (Ta), tungsten (W), copper (Cu), and molybdenum (Mo). The first source/drain conductive layer 130 may be a single-layered film as shown in the drawing. However, the present invention is not limited thereto, and the first source/drain conductive layer 130 may be a multi-layered film. For example, the first source/drain conductive layer 130 may have a laminate structure of Ti/Al/Ti, Mo/Al/Mo, Mo/AlGe/Mo, and Ti/Cu.

A first via layer 171 may be disposed on the first source/drain conductive layer 130. The first via layer 171 may include an organic insulating material such as polyacrylate resin, epoxy resin, phenolic resin, polyamide resin, polyimide resin, unsaturated polyester resin, polyphenylene resin, polyphenylene sulfide resin, or benzocyclobutene (BCB).

A second source/drain conductive layer 140 may be disposed on the first via layer 171. The second source/drain conductive layer 140 may include a data signal line (DL) 140a, a connection electrode (CE) 140b, and a power supply voltage line 140c. The data signal line (DL) 140a may be electrically connected to the source electrode 130a of the thin film transistor (TFT) through a contact hole penetrating the first via layer 171. The connection electrode (CE) 140b may be electrically connected to the drain electrode (DE)

130b of the thin film transistor (TFT) through a contact hole penetrating the first via layer 171. The power supply voltage line 140c may be electrically connected to the power supply voltage electrode 130c through a contact hole penetrating the first via layer 171.

The second source/drain conductive layer 140 may include at least one metal selected from aluminum (Al), platinum (Pt), palladium (Pd), silver (Ag), magnesium (Mg), gold (Au), nickel (Ni), neodymium (Nd), iridium (Ir) (Ca), titanium (Ti), tantalum (Ta), tungsten (W), copper (Cu), and molybdenum (Mo). The second source/drain conductive layer 140 may be a single-layered film. However, the present invention is not limited thereto, and the second source/drain conductive layer 140 may be a multi-layered film. For example, the second source/drain conductive layer 140 may have a laminate structure of Ti/Al/Ti, Mo/Al/Mo, Mo/AlGe/Mo, and Ti/Cu.

A second via layer 172 may be disposed on the second source/drain conductive layer 140. The second via layer 172 may include an organic insulating material such as poly-acrylate resin, epoxy resin, phenolic resin, polyamide resin, polyimide resin, unsaturated polyester resin, polyphenylene resin, polyphenylene sulfide resin, or benzocyclobutene (BCB).

An anode electrode (ANO) 150 is disposed on the second via layer 172. The anode electrode 150 may be connected to the connection electrode 140b through a contact hole penetrating the second via layer 172, and thus may be electrically connected to the drain electrode 130b of the thin film transistor (TFT).

A pixel defining film 164 may be formed on the anode electrode 150. The pixel defining film 164 may include an opening exposing the anode electrode 150. The pixel defining film 164 may be made of an organic insulating material or an inorganic insulating material. In an exemplary embodiment, the pixel defining film 164 may include a material such as a photoresist, a polyimide resin, an acrylic resin, a silicon compound, or a polyacrylic resin.

An organic layer EL may be disposed on the upper surface of the anode electrode (150) and in the opening of the pixel defining film 164. Although it is shown in the drawing that the organic layer EL is disposed only in the opening of the pixel defining film 164, the present invention is not limited thereto, and the organic layer EL may be disposed to extend from the opening of the pixel defining film 164 to the upper surface of the pixel defining film 164.

The organic layer EL may include an organic light emitting layer EL1, a hole injecting/transporting layer EL2, and an electron injecting/transporting layer EL3. Although it is shown in the drawing that each of the hole injecting/transporting layer EL2 and the electron injecting/transporting layer EL3 is one layer, each of them may be a laminate of a plurality of layers. Further, at least one of the hole injecting/transporting layer EL2 and the electron injecting/transporting layer EL3 may be a common layer disposed over a plurality of pixels.

A cathode electrode (CAT) 160 is disposed on the organic EL layer and the pixel defining film 164. The cathode electrode 160 may be a common electrode disposed over a plurality of pixels.

A thin film encapsulation layer 180 is disposed over the organic layer EL. The thin film encapsulation layer 180 may cover an organic light emitting element OLED. The thin film encapsulation layer 180 may be a laminate in which inorganic films and organic films are alternately laminated. For example, the thin film encapsulation layer 180 may include a first inorganic film 181, an organic film 182, and a second inorganic film 183, which are sequentially laminated.

A touch member 200 may be disposed on the thin film encapsulation layer 180. In an exemplary embodiment, the touch member 200 may be an electrostatic capacitive type touch member. The touch member 200 may be disposed directly on the thin film encapsulation layer 180 without a separate adhesive layer, or may be coupled to the thin film encapsulation layer 180 through the adhesive layer.

Hereinafter, the structure of the pad terminal PE of the pad area PA according to an exemplary embodiment will be described in detail.

Figure 5:
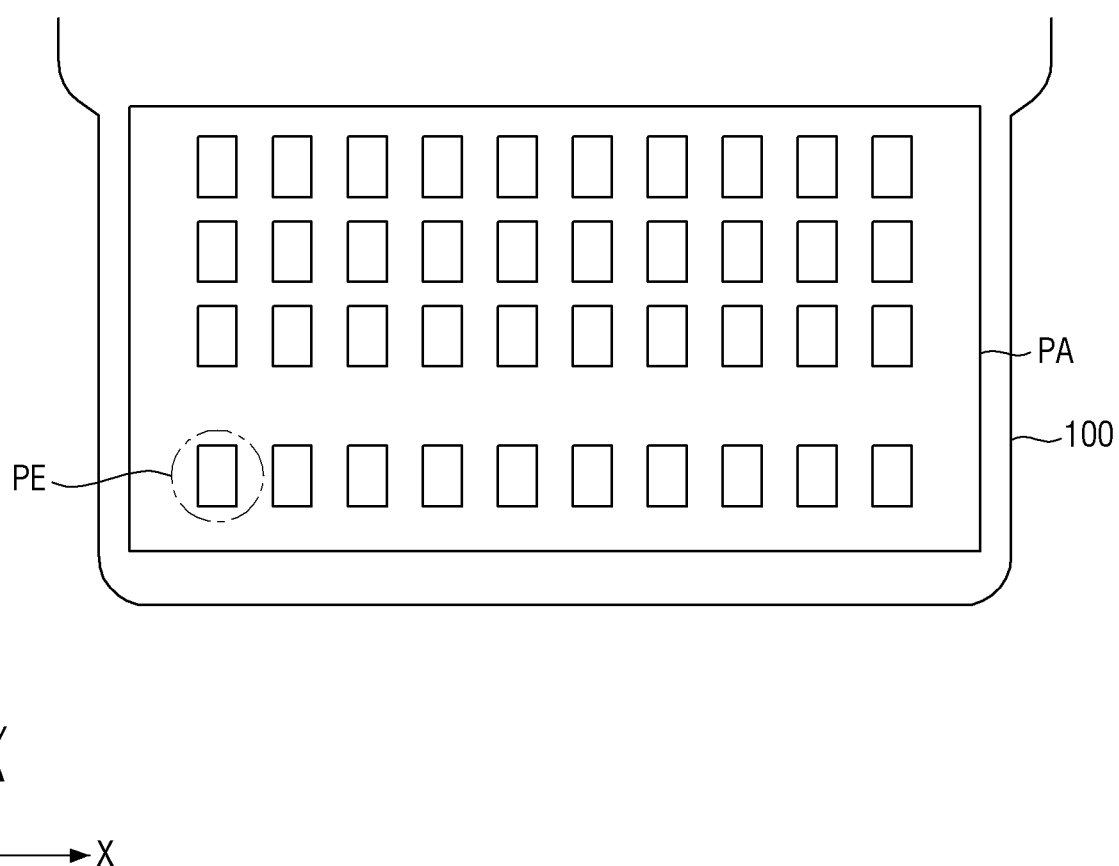
FIG. 5 is a plan view of the pad terminal of FIG. 1.
Figure 6:
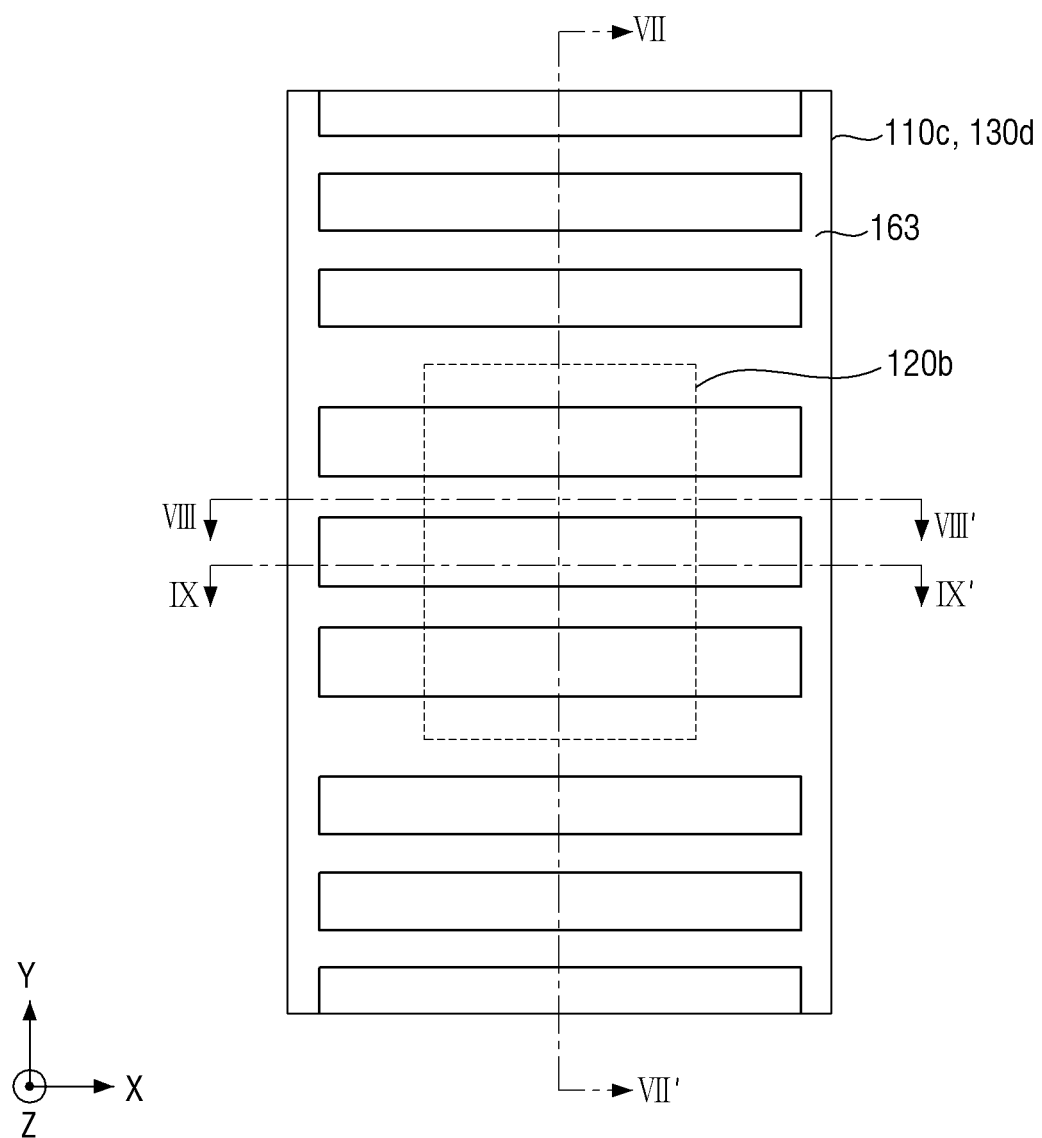
FIG. 6 is an enlarged view of one pad terminal of FIG. 5 according to an exemplary embodiment.
Figure 7:
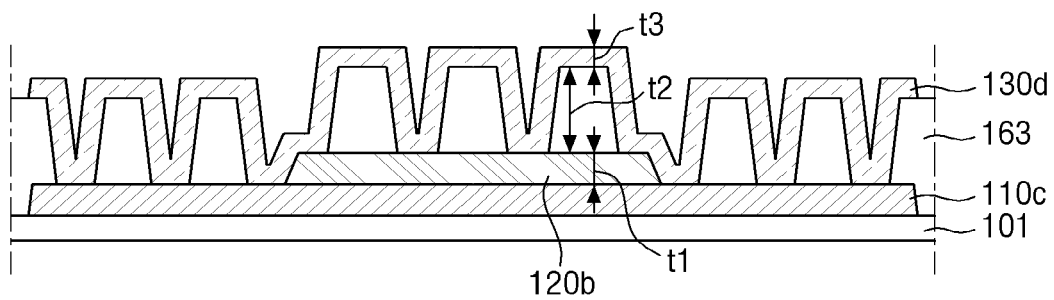
FIG. 7 is a cross-sectional view taken along the line VII-VII' in FIG. 6.
Figure 8:
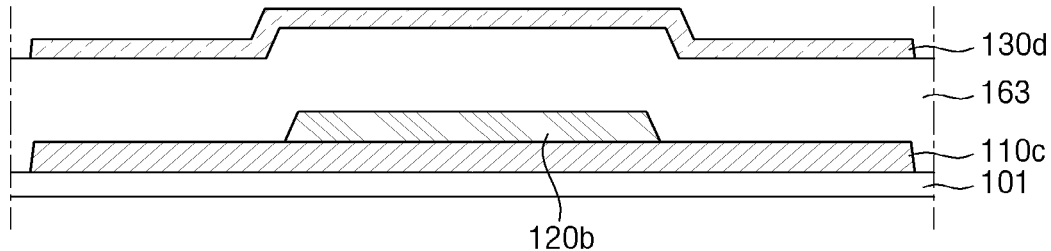
FIG. 8 is a cross-sectional view taken along the line VIII-VIII' in FIG. 6.
Figure 9:
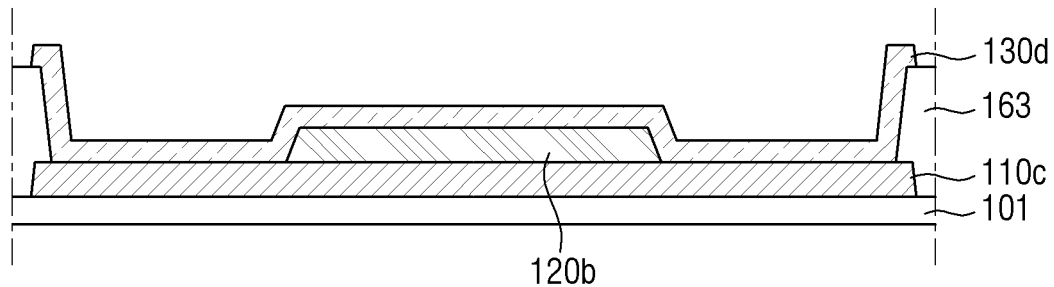
FIG. 9 is a cross-sectional view taken along the line IX-IX' in FIG. 6.

FIG. 5 is a plan view of the pad terminal of FIG. 1, FIG. 6 is an enlarged view of one pad terminal of FIG. 5 according to an exemplary embodiment, FIG. 7 is a cross-sectional view taken along the line VII-VII' in FIG. 6, FIG. 8 is a cross-sectional view taken along the line VIII-VIII' in FIG. 6, and FIG. 9 is a cross-sectional view taken along the line IX-IX' in FIG. 6.

Referring to FIGS. 5 to 9, the pad area PA includes a plurality of pad terminals PE. The plurality of pad terminals PE may be arranged at a predetermined distance in the X and Y directions. The plurality of pad terminals PE may be electrically connected to the display area DA through wirings (not shown) extending in the display area DA.

Each of the pad terminals PE includes a first pad electrode 110c, a second pad electrode 120b, and a third pad electrode 130d. In the pad terminal PE, the second pad electrode 120b has a smaller size than the first pad electrode 110c and the third pad electrode 130d. That is, the first pad electrode 110c and the third pad electrode 130d may extend outward from the side surface of the second pad electrode 120b. Accordingly, the pad terminal PE may be provided with the third pad electrode 130d and/or the first pad electrode 110c, and simultaneously may include a region where the second pad electrode 120b is disposed and a region where the second pad electrode 120b is not disposed. The pad terminal PE may include a step corresponding to the thickness of the second pad electrode 120b between the region where the second pad electrode 120b is disposed and the region where the second pad electrode 120b is not disposed.

The third insulating layer 163 may include a plurality of openings. Each of the openings extends in the X-direction, and the plurality of openings may be arranged in parallel in the Y-direction.

Convex portions protruding upward (thickness direction) as compared with the openings may be formed between the plurality of openings. In an exemplary embodiment, each of the convex portions may have a patterned strip shape. Although it is shown in the drawings that each of the convex portions has a linear strip-shape, the present invention is not limited thereto, and convex portions that can be seen in a substantially strip shape may be included. The "substantially strip shape" means that the convex portion extending in the X direction is not disconnected in the middle and has a structure connected to the third insulating layer 163 (left in the drawing) and the third insulating layer 163 (right in the drawing). For example, even when the convex portion is a curved, it may be seen to have a substantially strip shape. The plurality of openings may be arranged over the region where the second pad electrode 120b is disposed and the region where the second pad electrode 120b is not disposed.

As shown in FIGS. 7 to 9, the second pad electrode 120b may be disposed directly on the first pad electrode 110c. As a result, the third pad electrode 130d disposed on the second pad electrode 120b and the convex portions of the third insulating layer 163 may protrude in the Z direction by the thickness t1 of the second pad electrode 120b as compared with the third pad electrode 130d disposed on the convex portions of the third insulating layer 163. Similarly, the third pad electrode 130d disposed on the second pad electrode 120b and the openings of the third insulating layer 163 may protrude in the Z direction by the thickness t1 of the second pad electrode 120b as compared with the third pad electrode 130d disposed on the openings of the third insulating layer 163.

The third insulating layer 163 may be disposed on the exposed upper surface of the first pad electrode 110c and on the second pad electrode 120b. The third pad electrode 130d may extend over the third insulating layer 163 having a structure in which the plurality of openings and the plurality of convex portions are alternately repeated. Although it is shown in the drawing that the third pad electrode 130d extends over the first pad electrode 110c and the third insulating layer 163, the present invention is not limited thereto, and the third pad electrode 130d may be disposed on a part of the first pad electrode 110c and a part of the third insulating layer 163 to a region where the third pad electrode 130d directly contacts the first pad electrode 110c with respect to the center of the second pad electrode 120b. That is, the third pad electrode 130d may not overlap the first pad electrode 110c and the third insulating layer 163 in a region except for the region where the third pad electrode 130d directly contacts the first pad electrode 110c from the center of the second pad electrode 120b.

The third pad electrode 130d disposed directly on the third insulating layer 163 may have a predetermined concave-convex structure due to the above structure of the third insulating layer 163 in which the plurality of convex portions and the plurality of openings are alternately repeated. Specifically, the third pad electrode 130d disposed on the second pad electrode 120b and the convex portions of the third insulating layer 163 may protrude in the Z direction by the thickness t2 of the convex portion as compared with the third pad electrode 130d disposed on the openings of the third insulating layer 163.

In the region where the second pad electrode 120b is not disposed, the third pad electrode 130d may be directly electrically connected to the first pad electrode 110c. Further, in the region where the second pad electrode 120b is disposed, the third pad electrode 130d is in direct contact with the exposed upper surface of the second pad electrode 120b through the plurality of openings to be electrically connected to the second pad electrode 120b. Further, the third pad electrode 130d may be in contact with the first pad electrode 110c and the second pad electrode 120b through the opening between the convex portion of the third insulating layer 163 directly disposed on the first pad electrode 110c and the convex portion of the third insulating layer 163 disposed directly on the second pad electrode 120b to be electrically connect to the first pad electrode 110c and the second pad electrode 120b. That is, the third pad electrode 130d may not electrically connected to the first pad electrode 110c and the second pad electrode 120b over the entire region, but may be connected thereto through the plurality of opening obtained by removing a part of the third insulating layer 163.

When the third pad electrode 130d has an uneven surface as described above, the bonding reliability of the driving member with respect to the pad terminal PE can be improved. That is, as described with reference to FIG. 3, when the bumps of the driving member is placed on the pad terminals PE and ultrasonic treatment is performed under a constant pressure, the pressing stress and frictional force applied to the respective pad terminals PE shown in FIG. 5 may be different. This may cause the uniform bonding reliability of all pad terminals PE to deteriorate.

As in this exemplary embodiment, when the pad terminal PE has an uneven surface, the pressing stress concentrates on the convex portions, and the frictional force on the convex portions increases. As a result, the third pad electrode 130d and the bump are melted well, and thus the bonding therebetween may be performed well. Therefore, uniform bonding can be achieved without deviation according to the position of the pad terminal PE, and bonding reliability of the driving member can be improved.

Hereinafter, other exemplary embodiments will be described. In the following exemplary embodiments, the same components as those in the previously described exemplary embodiments are referred to as the same reference numerals, and descriptions thereof is omitted or simplified.

Figure 10:
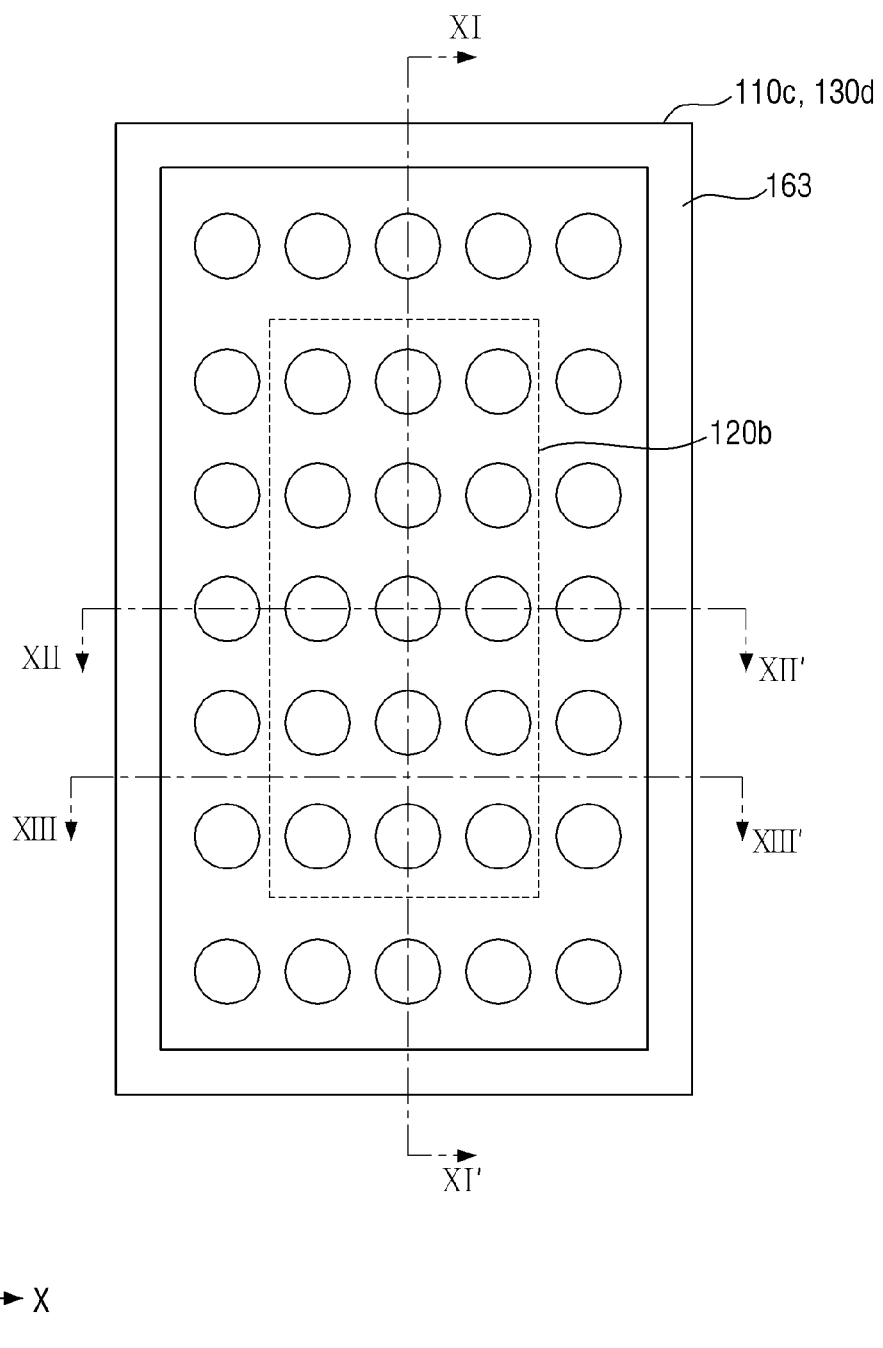
FIG. 10 is an enlarged plan view of one pad terminal according to another exemplary embodiment.
Figure 11:
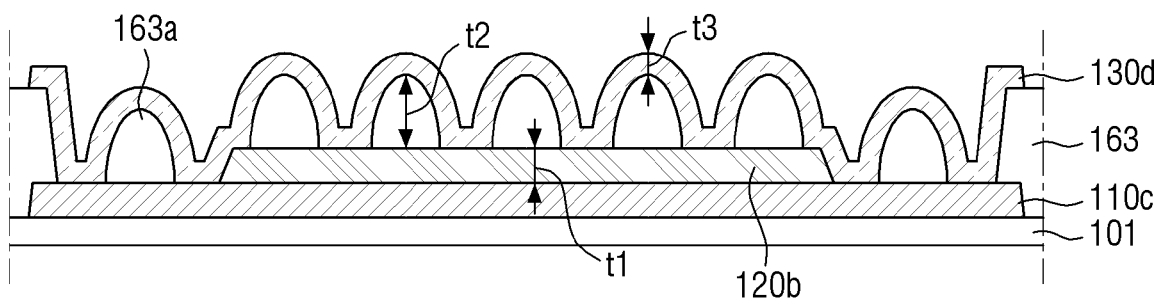
FIG. 11 is a cross-sectional view taken along the line XI-XI' in FIG. 10.
Figure 12:
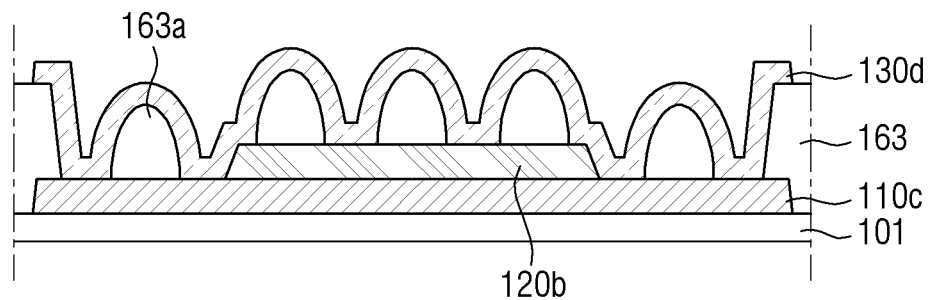
FIG. 12 is a cross-sectional view taken along the line XII-XII' in FIG. 10.
Figure 13:
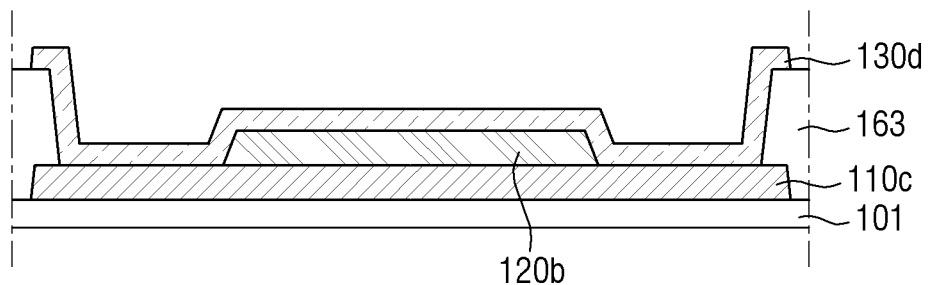
FIG. 13 is a cross-sectional view taken along the line XIII-XIII' in FIG. 10.

FIG. 10 is an enlarged plan view of one pad terminal according to another exemplary embodiment, and FIGS. 11, 12, and 13 are cross-sectional views taken along the line XI-XI', XII-XII', and XIII-XIII' in FIG. 10, respectively.

Referring to FIGS. 10 to 13, a display device according to this exemplary embodiment is different from the display device according to the exemplary embodiment of FIGS. 5 to 9 in that the convex portion of the third insulating layer 163 has a patterned island shape.

More specifically, the third insulating layer 163 may include a plurality of openings, and convex portions protruding upward as compared with the plurality of openings may be formed between the plurality of openings. Each of the convex portions may have a patterned island shape in the exemplary embodiment. Although it is shown in the drawing that each of the island-shaped convex portions is circular, the present invention is not limited thereto. It is sufficient that the convex portions disposed between the plurality of openings are spaced apart from each other in the X and Y directions at predetermined intervals on the first pad electrode 110c and the second pad electrode 120b, and the shape of each of the convex portions is not limited.

Even in the case of this exemplary embodiment, when the pad terminal PE has an uneven surface, the pressing stress concentrates on the convex portions, and the frictional force on the convex portions increases. As a result, the third pad electrode 130d and the bump are melted well, and thus the bonding therebetween may be performed well. Therefore, uniform bonding can be achieved without deviation according to the position of the pad terminal PE, and bonding reliability of the driving member can be improved.

Figure 14A:
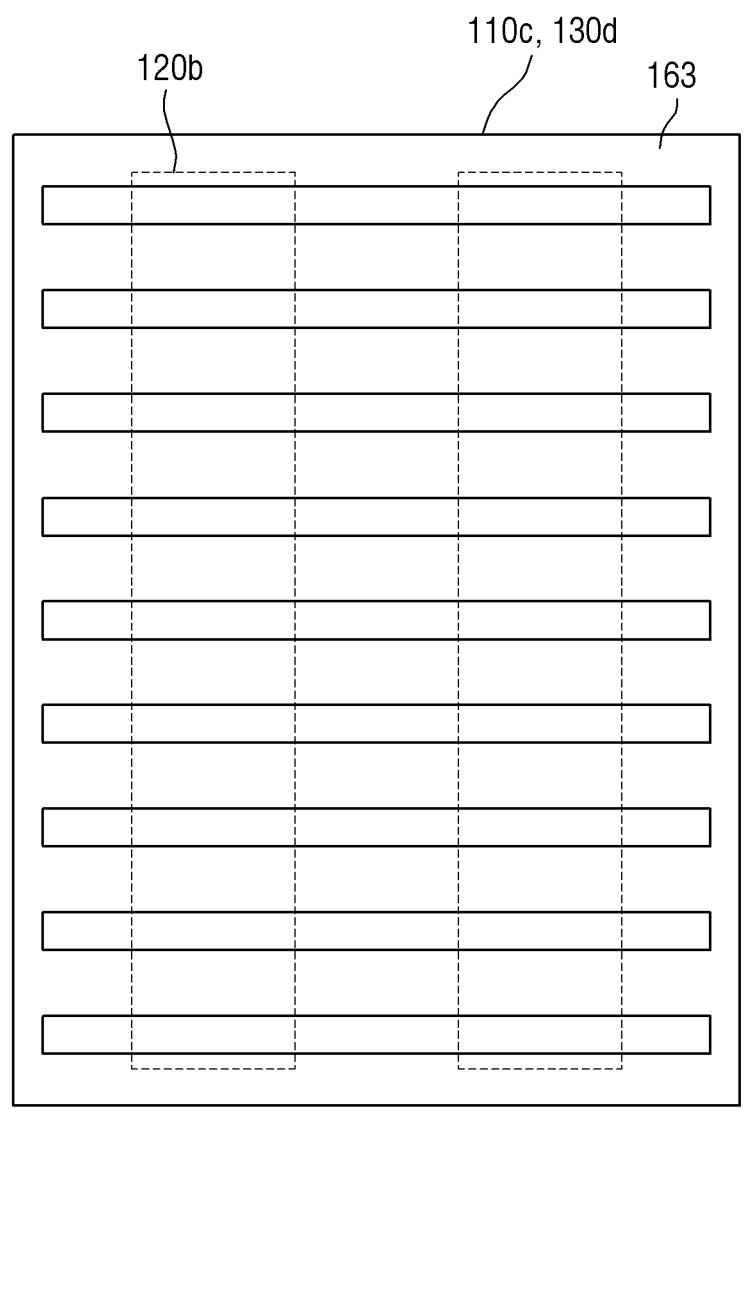
FIG. 14A is an enlarged plan view of one pad terminal according to still another exemplary embodiment.
Figure 14B:
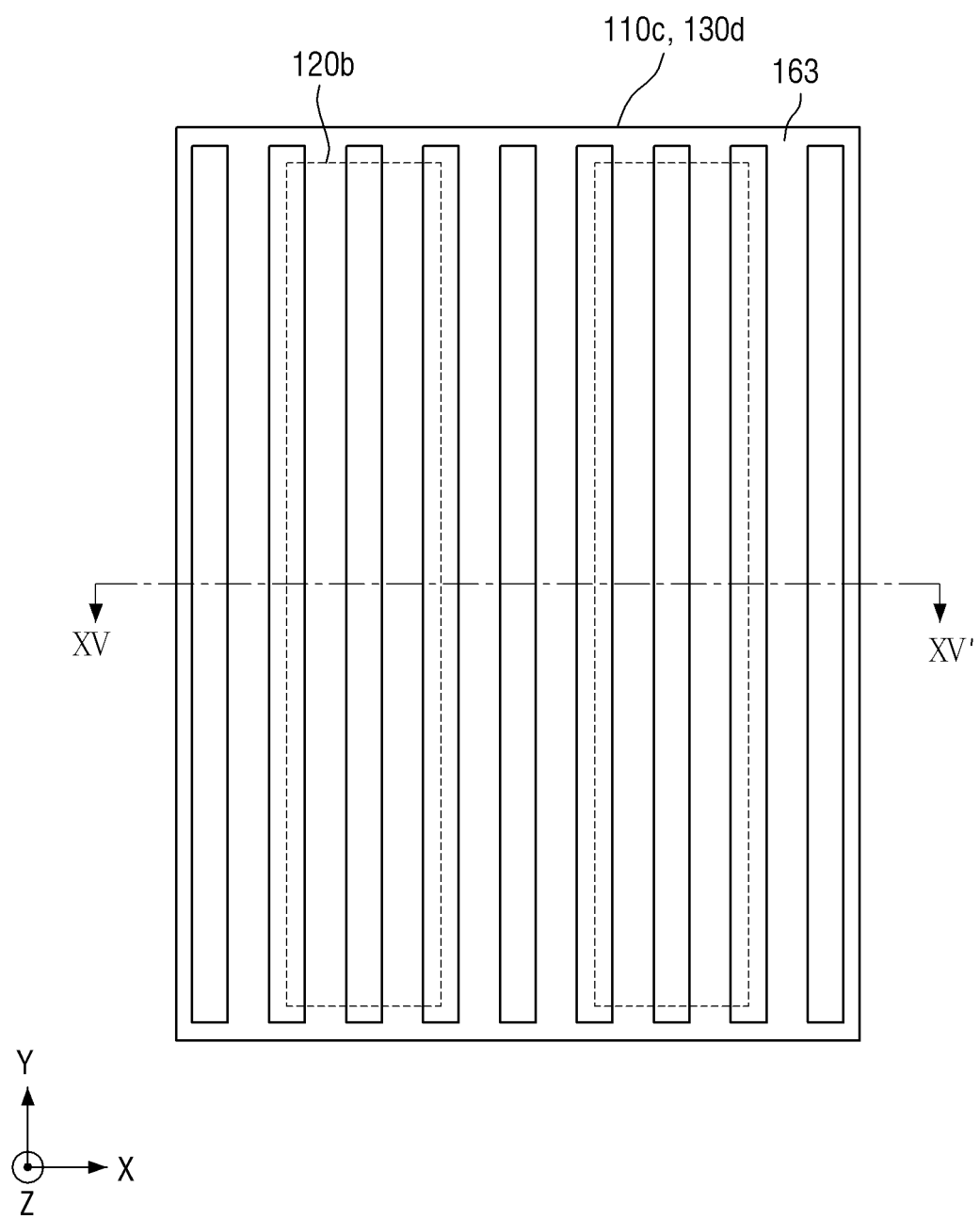
FIG. 14B is an enlarged plan view of one pad terminal according to still another exemplary embodiment.
Figure 15:
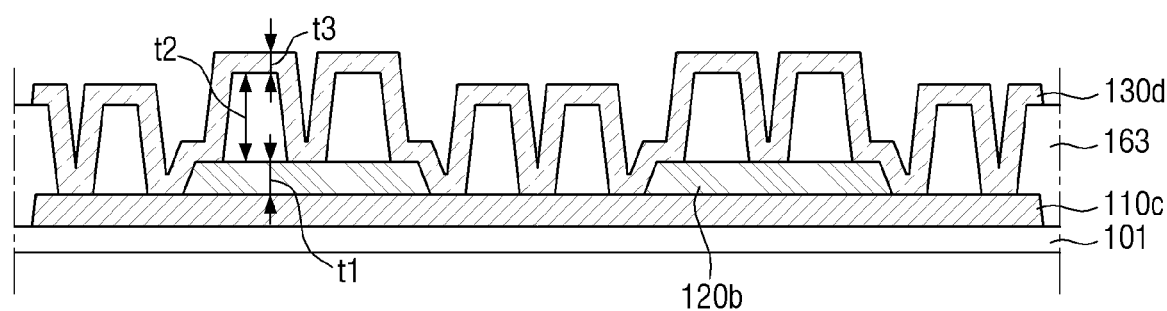
FIG. 15 is a cross-sectional view taken along the line XV-XV' in FIG. 14B.

FIG. 14A is an enlarged plan view of one pad terminal according to still another exemplary embodiment, FIG. 14B is an enlarged plan view of one pad terminal according to still another exemplary embodiment, and FIG. 15 is a cross-sectional view taken along the line XV-XV' in FIG. 14B.

FIGS. 14A to 15 illustrate that a plurality of second pad electrodes 120b may be arranged on the first pad electrode 110c in the X direction.

More specifically, as shown in FIGS. 14A to 15, a plurality of second pad electrodes 120b may be arranged on the first pad electrode 110c in the X direction shorter than the Y direction. FIGS. 14A to 15 show a display device including a strip-shaped concave-convex structure extending in the X and Y directions on the second pad electrode 120b. Although it is shown in the drawings that only two second pad electrodes 120b are arranged on the pad area PA, the present invention is not limited thereto, and two or more second pad electrodes 120b may be arranged thereon. In a region where the plurality of the second pad electrodes 120b are arranged in the X direction shorter than the Y direction, a step may be formed in the Z direction by t1, as compared with a region where the second pad electrode 120b is not disposed. That is, the pad terminal PE where the plurality of second pad electrodes 120b, the convex portions of the third insulating layer 163, and the third pad electrode 130d are arranged may have protrusions protruding in the Z direction by t1 as compared with the pad terminal PE where the convex portions of the third insulating layer 163 and the third pad electrode 130d are arranged. However, although it is shown in the drawings that the width of the pad terminal PE according to this exemplary embodiment in the X direction is shorter than the width thereof in the Y direction, the present invention is not limited thereto. The width thereof in the X direction may be longer than the width thereof in the Y direction, and the width thereof in the Y direction may be equal to the width thereof in the X direction.

Even in the case of this exemplary embodiment, when the pad terminal PE has an uneven surface, the pressing stress concentrates on the convex portions, and the frictional force on the convex portions increases. As a result, the third pad electrode 130d and the bump are melted well, and thus the bonding therebetween may be performed well. Therefore, uniform bonding can be achieved without deviation according to the position of the pad terminal PE, and bonding reliability of the driving member can be improved.

Figure 16A:
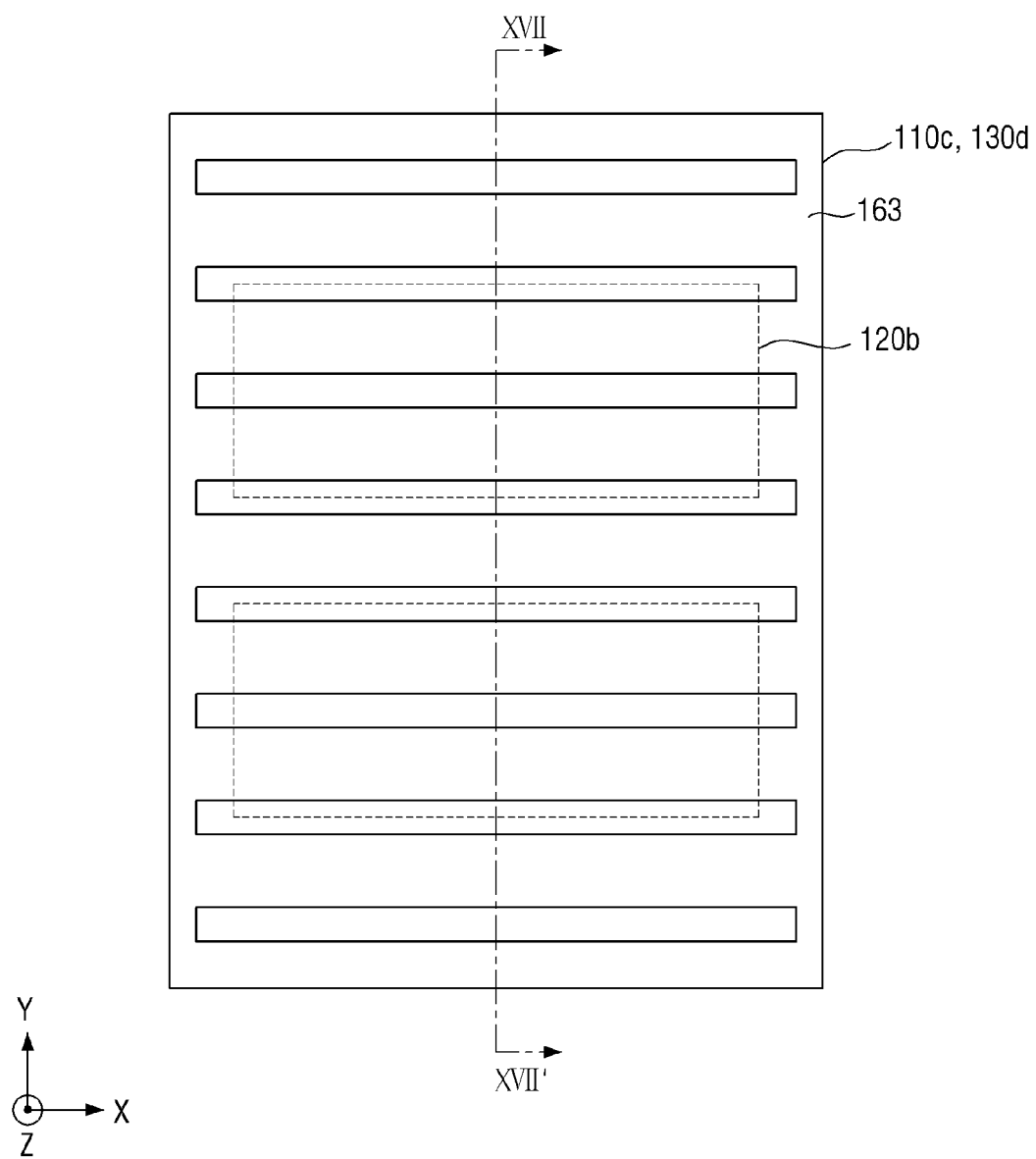
FIG. 16A is an enlarged plan view of one pad terminal according to still another exemplary embodiment.
Figure 16B:
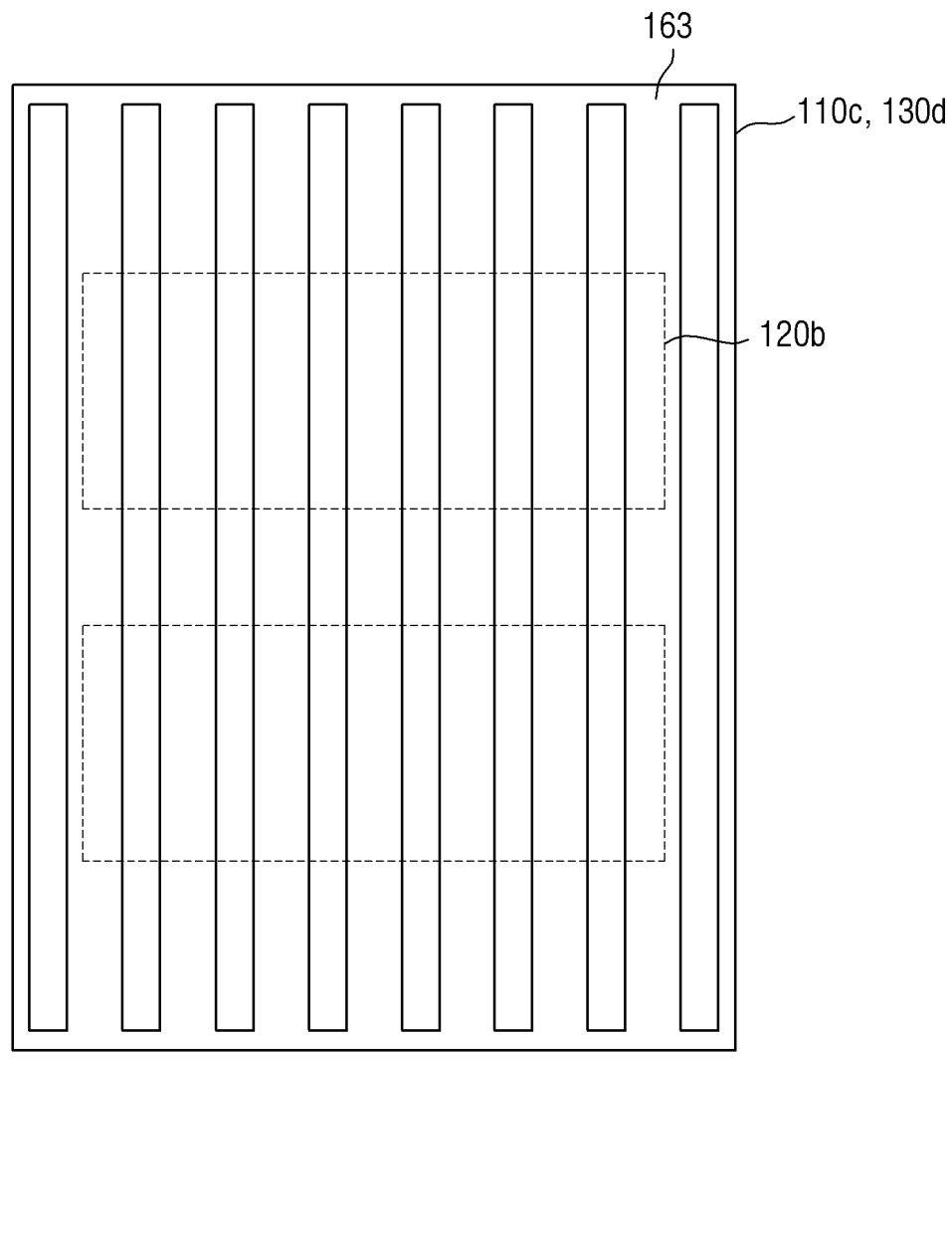
FIG. 16B is an enlarged plan view of one pad terminal according to still another exemplary embodiment.
Figure 17:
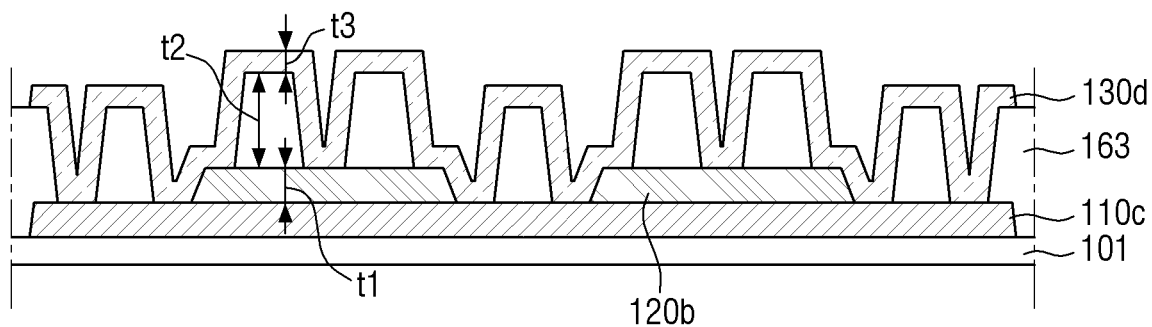
FIG. 17 is a cross-sectional view taken along the line XVII-XVII' in FIG. 16A.

FIG. 16A is an enlarged plan view of one pad terminal according to still another exemplary embodiment, FIG. 16B is an enlarged plan view of one pad terminal according to still another exemplary embodiment, and FIG. 17 is a cross-sectional view taken along the line XVII-XVII' in FIG. 16A.

FIGS. 16A to 17 illustrate that a plurality of second pad electrodes 120b may be arranged on the first pad electrode 110c in the Y direction.

More specifically, as shown in FIGS. 16A to 17, a plurality of second pad electrodes 120b may be arranged on the first pad electrode 110c in the Y direction longer than the X direction. FIGS. 16A and 16B show a display device including a strip-shaped concave-convex structure extending in the X and Y directions on the second pad electrode 120b. Although it is shown in the drawings that only two second pad electrodes 120b are arranged on the pad area PA, the present invention is not limited thereto, and two or more second pad electrodes 120b may be arranged thereon. In a region where the plurality of the second pad electrodes 120b are arranged in the Y direction longer than the X direction, a step may be formed in the Z direction by t1, as compared with a region where the second pad electrode 120b is not disposed. That is, the pad terminal PE where the plurality of second pad electrodes 120b, the convex portions of the third insulating layer 163, and the third pad electrode 130d are arranged may have protrusions protruding in the Z direction by t1 as compared with the pad terminal PE where the convex portions of the third insulating layer 163 and the third pad electrode 130d are arranged. However, although it is shown in the drawings that the width of the pad terminal PE according to this exemplary embodiment in the X direction is shorter than the width thereof in the Y direction, the present invention is not limited thereto. The width thereof in the X direction may be longer than the width thereof in the Y direction, and the width thereof in the Y direction may be equal to the width thereof in the X direction.

Even in the case of this exemplary embodiment, when the pad terminal PE has an uneven surface, the pressing stress concentrates on the convex portions, and the frictional force on the convex portions increases. As a result, the third pad electrode 130d and the bump are melted well, and thus the bonding therebetween may be performed well. Therefore, uniform bonding can be achieved without deviation according to the position of the pad terminal PE, and bonding reliability of the driving member can be improved.

Figure 18:
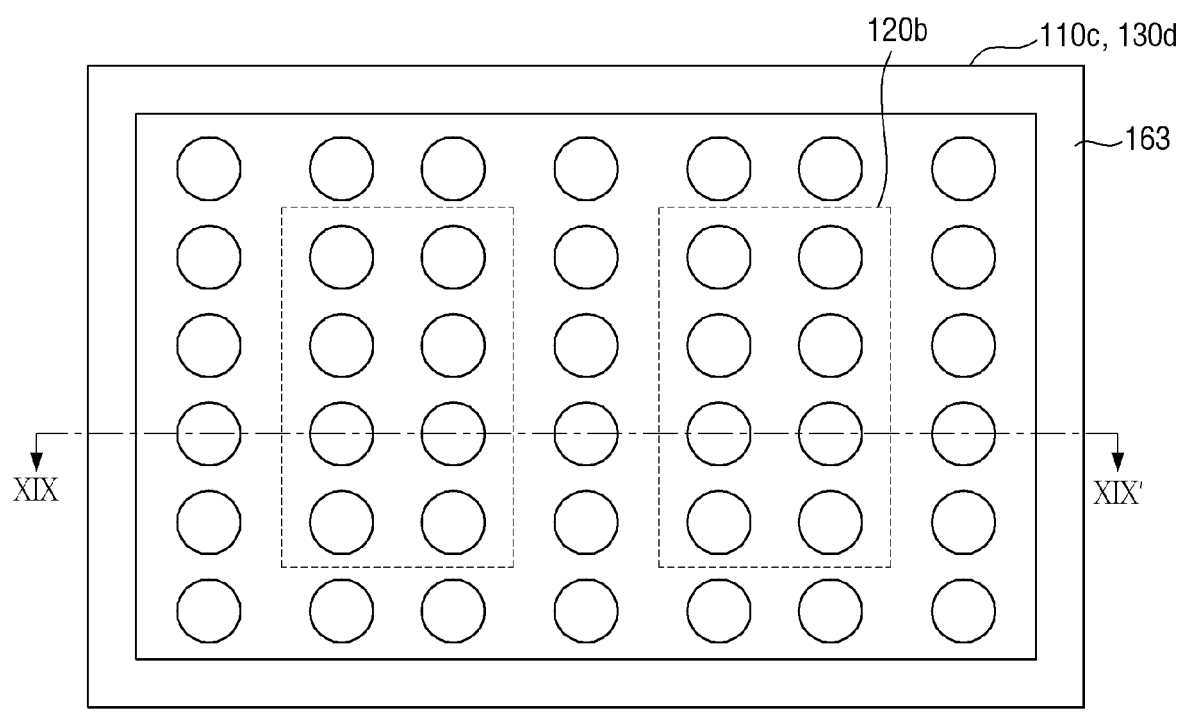
FIG. 18 is an enlarged plan view of one pad terminal according to still another exemplary embodiment.
Figure 19:
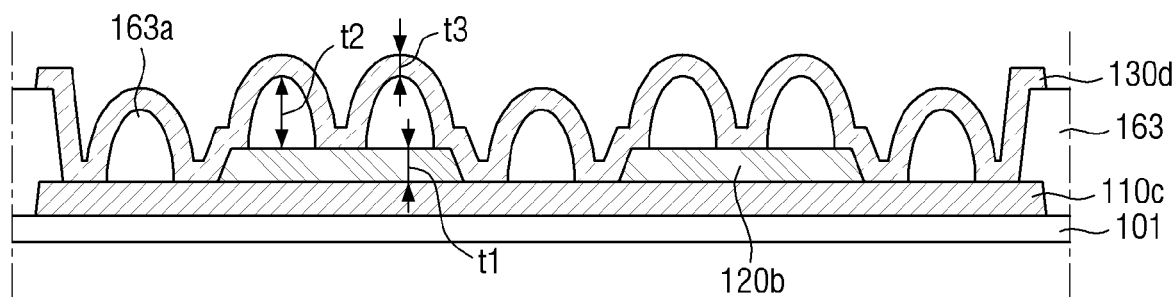
FIG. 19 is a cross-sectional view taken along the line XIX-XIX' in FIG. 18.

FIG. 18 is an enlarged plan view of one pad terminal PE according to still another exemplary embodiment, and FIG. 19 is a cross-sectional view taken along the line XIX-XIX'.

Referring to FIGS. 18 and 19, a display device according to this exemplary embodiment is different from the display device according to the exemplary embodiment of FIGS. 5 to 9 in that the convex portion of the third insulating layer 163 has a patterned island shape.

More specifically, as shown in FIGS. 18 and 19, a plurality of second pad electrodes 120b may be arranged on the first pad electrode 110c in the X direction shorter than the Y direction. Although it is shown in the drawings that only two second pad electrodes 120b are arranged on the pad area PA, the present invention is not limited thereto, and two or more second pad electrodes 120b may be arranged thereon. In a region where the plurality of the second pad electrodes 120b are arranged in the X direction shorter than the Y direction, a step may be formed in the Z direction by t1, as compared with a region where the second pad electrode 120b is not disposed. That is, the pad terminal PE where the plurality of second pad electrodes 120b, the convex portions of the third insulating layer 163, and the third pad electrode 130d are arranged may have protrusions protruding in the Z direction by t1 as compared with the pad terminal PE where the convex portions of the third insulating layer 163 and the third pad electrode 130d are arranged. However, although it is shown in the drawings that the width of the pad terminal PE according to this exemplary embodiment in the X direction is shorter than the width thereof in the Y direction, the present invention is not limited thereto. The width thereof in the X direction may be longer than the width thereof in the Y direction, and the width thereof in the Y direction may be equal to the width thereof in the X direction.

Further, the third insulating layer 163 may include a plurality of openings, and convex portions protruding upward as compared with the plurality of openings may be formed between the plurality of openings. Each of the convex portions may have a patterned island shape in the exemplary embodiment. Although it is shown in the drawing that each of the island-shaped convex portions is circular, the present invention is not limited thereto. It is sufficient that the convex portions disposed between the plurality of openings are spaced apart from each other in the X and Y directions at predetermined intervals on the first pad electrode 110c and the second pad electrode 120b, and the shape of each of the convex portions is not limited.

Even in the case of this exemplary embodiment, when the pad terminal PE has an uneven surface, the pressing stress concentrates on the convex portions, and the frictional force on the convex portions increases. As a result, the third pad electrode 130d and the bump are melted well, and thus the bonding therebetween may be performed well. Therefore, uniform bonding can be achieved without deviation according to the position of the pad terminal PE, and bonding reliability of the driving member can be improved.

Figure 20:
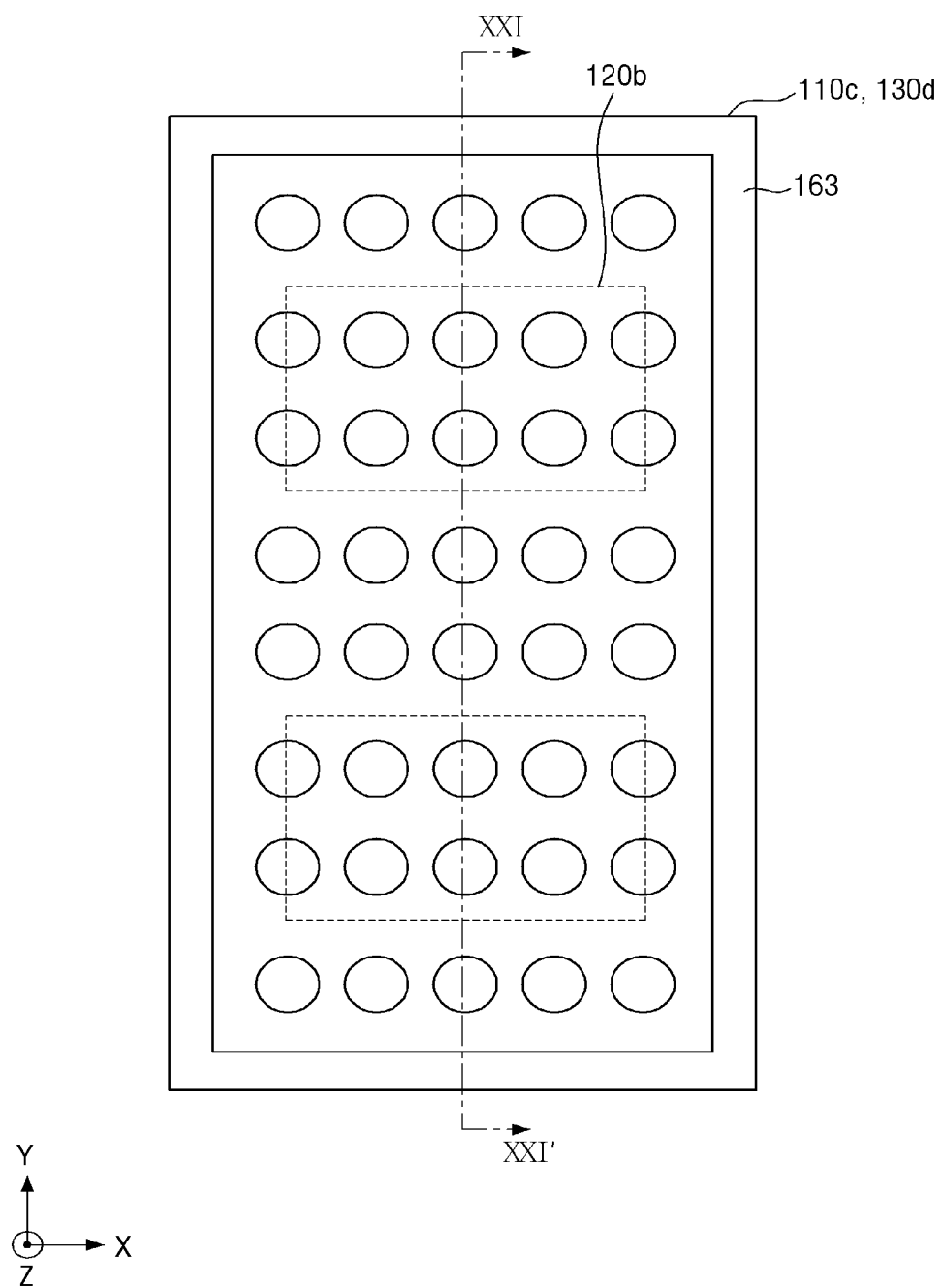
FIG. 20 is an enlarged plan view of one pad terminal according to still another exemplary embodiment.
Figure 21:
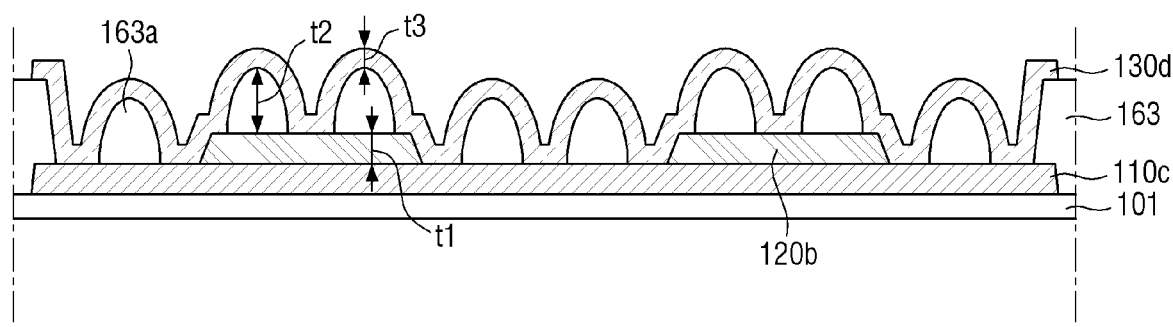
FIG. 21 is a cross-sectional view taken along the line XXI-XXI' in FIG. 20.

FIG. 20 is an enlarged plan view of one pad terminal PE according to still another exemplary embodiment, and FIG. 21 is a cross-sectional view taken along the line XXI-XXI'.

Referring to FIGS. 20 and 21, a display device according to this exemplary embodiment is different from the display device according to the exemplary embodiment of FIGS. 5 to 9 in that the convex portion of the third insulating layer 163 has a patterned island shape.

More specifically, as shown in FIGS. 20 and 21, a plurality of second pad electrodes 120b may be arranged on the first pad electrode 110c in the Y direction longer than the X direction. FIGS. 20 and 21 show a display device including a strip-shaped concave-convex structure extending in the X and Y directions on the second pad electrode 120b. Although it is shown in the drawings that only two second pad electrodes 120b are arranged on the pad area PA, the present invention is not limited thereto, and two or more second pad electrodes 120b may be arranged thereon. In a region where the plurality of the second pad electrodes 120b are arranged in the Y direction longer than the X direction, a step may be formed in the Z direction by t1, as compared with a region where the second pad electrode 120b is not disposed. That is, the pad terminal PE where the plurality of second pad electrodes 120b, the convex portions of the third insulating layer 163, and the third pad electrode 130d are arranged may have protrusions protruding in the Z direction by t1 as compared with the pad terminal PE where the convex portions of the third insulating layer 163 and the third pad electrode 130d are arranged. However, although it is shown in the drawings that the width of the pad terminal PE according to this exemplary embodiment in the X direction is shorter than the width thereof in the Y direction, the present invention is not limited thereto. The width thereof in the X direction may be longer than the width thereof in the Y direction, and the width thereof in the Y direction may be equal to the width thereof in the X direction.

Further, the third insulating layer 163 may include a plurality of openings, and convex portions protruding upward as compared with the plurality of openings may be formed between the plurality of openings. Each of the convex portions may have a patterned island shape in the exemplary embodiment. Although it is shown in the drawing that each of the island-shaped convex portions is circular, the present invention is not limited thereto. It is sufficient that the convex portions disposed between the plurality of openings are spaced apart from each other in the X and Y directions at predetermined intervals on the first pad electrode 110c and the second pad electrode 120b, and the shape of each of the convex portions is not limited.

Even in the case of this exemplary embodiment, when the pad terminal PE has an uneven surface, the pressing stress concentrates on the convex portions, and the frictional force on the convex portions increases. As a result, the third pad electrode 130d and the bump are melted well, and thus the bonding therebetween may be performed well. Therefore, uniform bonding can be achieved without deviation according to the position of the pad terminal PE, and bonding reliability of the driving member can be improved.

Figure 22:
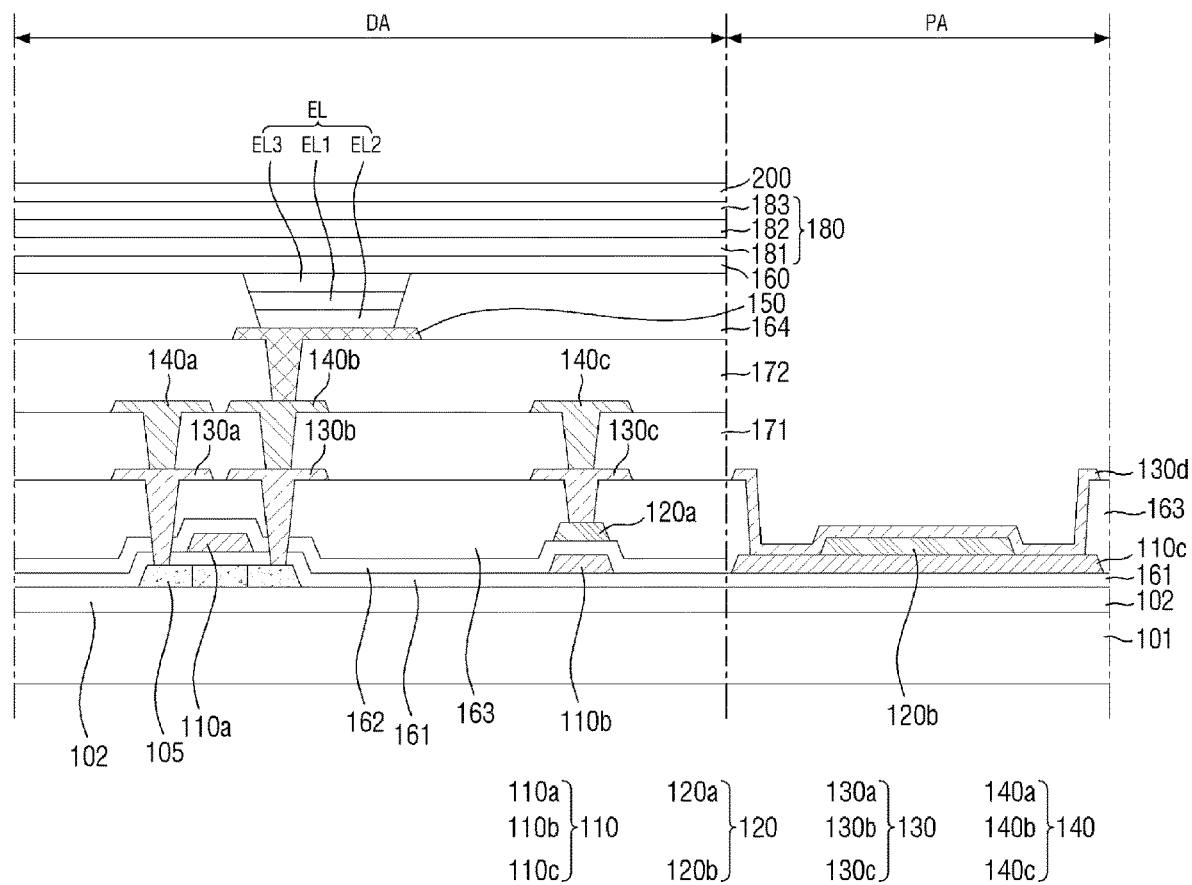
FIG. 22 is a cross-sectional view of a pad area of a display device according to still another exemplary embodiment.
Figure 23:
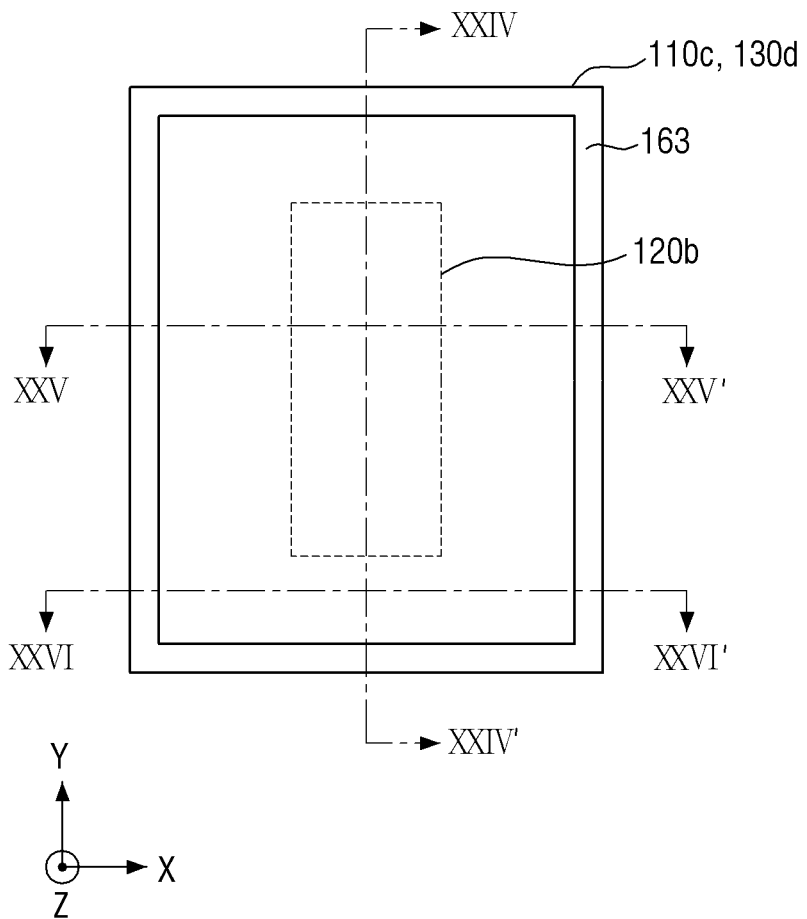
FIG. 23 is an enlarged view of one pad terminal.
Figure 24:
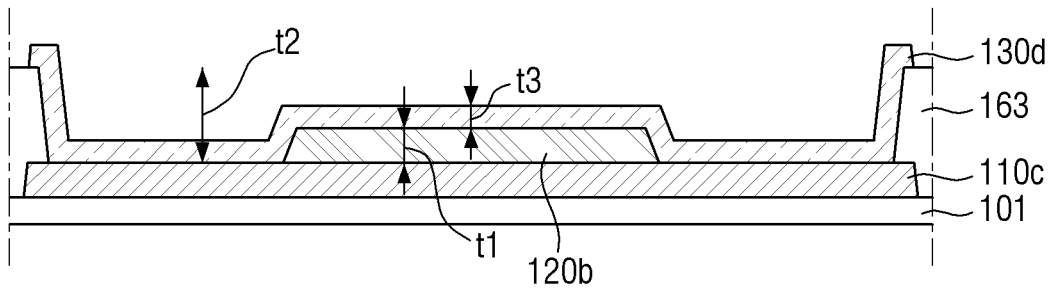
FIG. 24 is a cross-sectional view taken along the line XXIV-XXIV' in FIG. 23.
Figure 25:
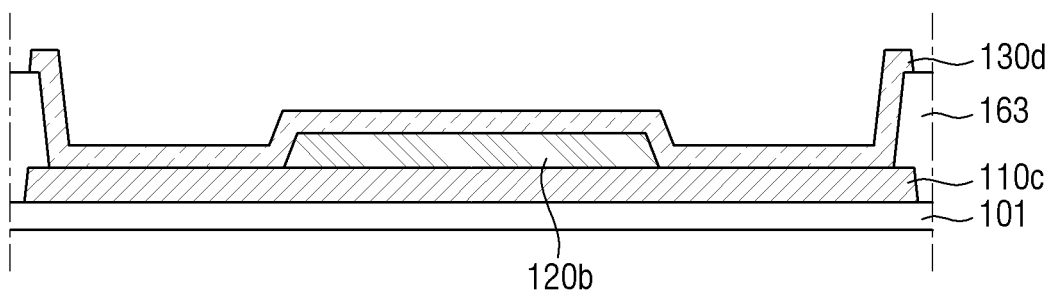
FIG. 25 is a cross-sectional view taken along the line XXV-XXV' in FIG. 23.
Figure 26:
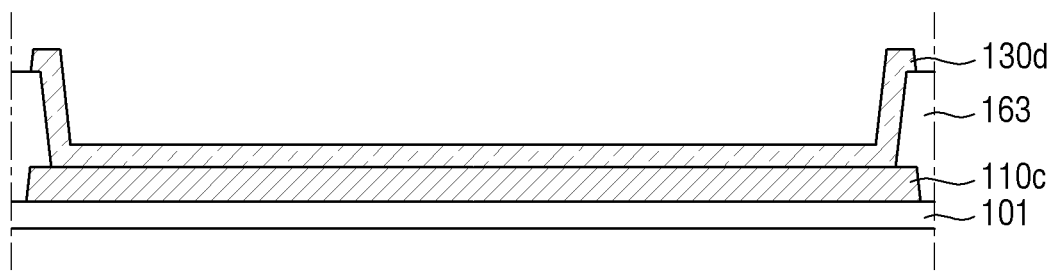
FIG. 26 is a cross-sectional view taken along the line XXVI-XXVI' in FIG. 23.

FIG. 22 is a cross-sectional view of a pad area of a display device according to still another exemplary embodiment, FIG. 23 is an enlarged view of one pad terminal, FIG. 24 is a cross-sectional view taken along the line XXIV-XXIV' in FIG. 23, FIG. 25 is a cross-sectional view taken along the line XXV-XXV' in FIG. 23, and FIG. 26 is a cross-sectional view taken along the line XXVI-XXVI' in FIG. 23.

Referring to FIGS. 22 and 26, a display device according to this exemplary embodiment is different from the display device according to the exemplary embodiment of FIGS. 5 to 9 in that the third insulating layer 163 has one opening.

More specifically, the third insulating layer 163 disposed on the first pad electrode 110c may include only one opening exposing the upper surface of the first pad electrode 110c and the upper surface of the second pad electrode 120b.

The third pad electrode 130d may be disposed on the third insulating layer 163 having one opening. Although it is shown in the drawings that the third pad electrode 130d is disposed over the entire third insulating layer 163 in the pad area PA, the present invention is not limited thereto, and the third pad electrode 130d may not overlap a region other than the opening of the third insulating layer 163.

The third pad electrode 130d may be electrically connected to the first pad electrode 110c and the second conductive electrode 120a through one opening of the third insulating layer 163. That is, the third pad electrode 130d may not be electrically connected to the first pad electrode 110c and the second pad electrode 120b over the entire region, but may be connected thereto through one opening obtained by removing a part of the third insulating layer 163.

Even in this case of this exemplary embodiment, a region where the third pad electrode 130d overlaps the second pad electrode 120b may protrude in the thickness direction by the thickness of the second pad electrode 120b as compared with a region where the second pad electrode 120b is not disposed. Accordingly, the upper surface of the third pad electrode 130d in one pad terminal PE includes protrusions. When the upper surface of the third pad electrode 130d includes the protrusions, the pressing stress concentrates on the protrusions, so that uniform bonding can be achieved without deviation according to the position of the pad terminal PE, and bonding reliability of the driving member can be improved.

Figure 27:
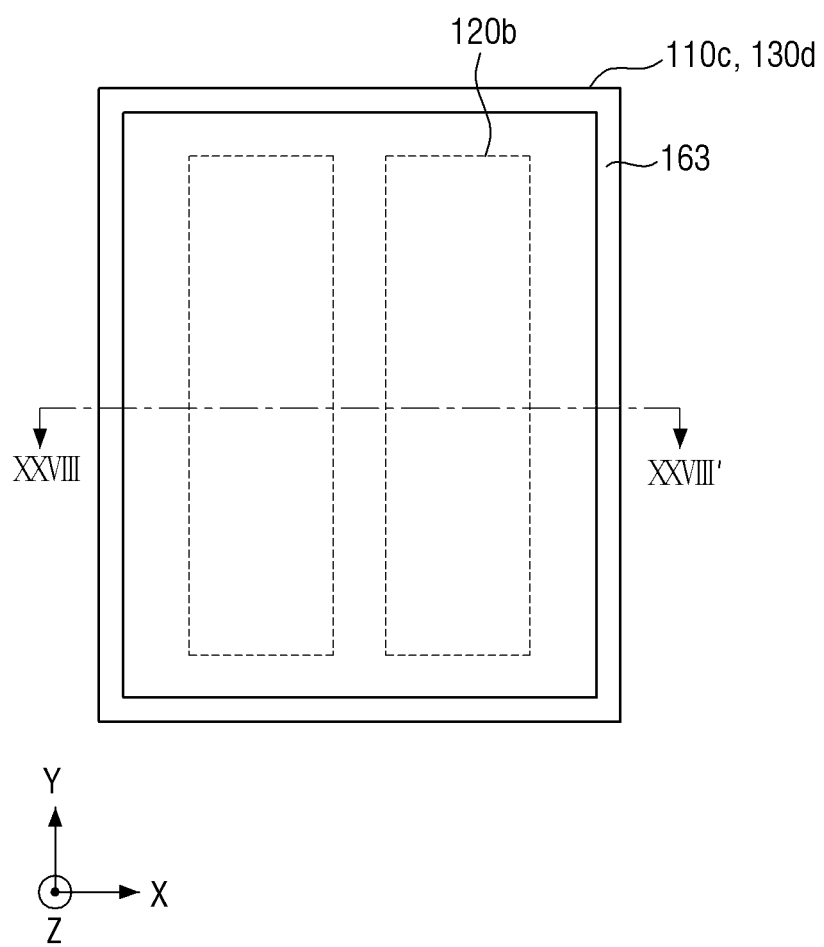
FIG. 27 is an enlarged plan view of one pad terminal according to still another exemplary embodiment.
Figure 28:
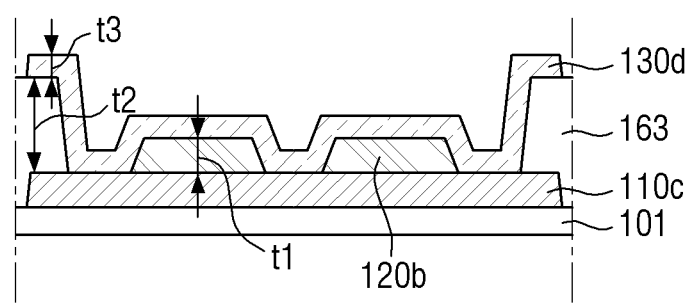
FIG. 28 is a cross-sectional view taken along the line XXVIII-XXVIII' in FIG. 27.

FIG. 27 is an enlarged plan view of one pad terminal according to still another exemplary embodiment, and FIG. 28 is a cross-sectional view taken along the line XXVIII-XXVIII' in FIG. 27.

Referring to FIGS. 27 and 28, a display device according to this exemplary embodiment is different from the display device according to the exemplary embodiment of FIGS. 5 to 9 in that the third insulating layer 163 has one opening and a plurality of second pad electrodes 120b are arranged in the X direction.

More specifically, a plurality of second pad electrodes 120b may be arranged on the first pad electrode 110c in the X direction. Further, the third insulating layer 163 disposed on the first pad electrode 110c may include only one opening exposing the upper surface of the first pad electrode 110c and the upper surface of the second pad electrode 120b. That is, the plurality of second pad electrodes 120b arranged in the X direction may overlap one opening of the third insulating layer 163.

The third pad electrode 130d may be disposed on the third insulating layer 163 having one opening. Although it is shown in the drawings that the third pad electrode 130d is disposed over the entire third insulating layer 163 in the pad area PA, the present invention is not limited thereto, and the third pad electrode 130d may not overlap a region other than the opening of the third insulating layer 163.

The third pad electrode 130d may be electrically connected to the first pad electrode 110c and the plurality of second conductive electrode 120a arranged in the X direction through one opening of the third insulating layer 163. That is, the third pad electrode 130d may not be electrically connected to the first pad electrode 110c and the plurality of second pad electrodes 120b arranged in the X direction over the entire region, but may be connected thereto through one opening obtained by removing a part of the third insulating layer 163.

Even in this case of this exemplary embodiment, a region where the third pad electrode 130d overlaps the second pad electrode 120b may protrude in the thickness direction by the thickness of the second pad electrode 120b as compared with a region where the second pad electrode 120b is not disposed. Accordingly, the upper surface of the third pad electrode 130d in one pad terminal PE includes protrusions. When the upper surface of the third pad electrode 130d includes the protrusions, the pressing stress concentrates on the protrusions, so that uniform bonding can be achieved without deviation according to the position of the pad terminal PE, and bonding reliability of the driving member can be improved.

Figure 29:
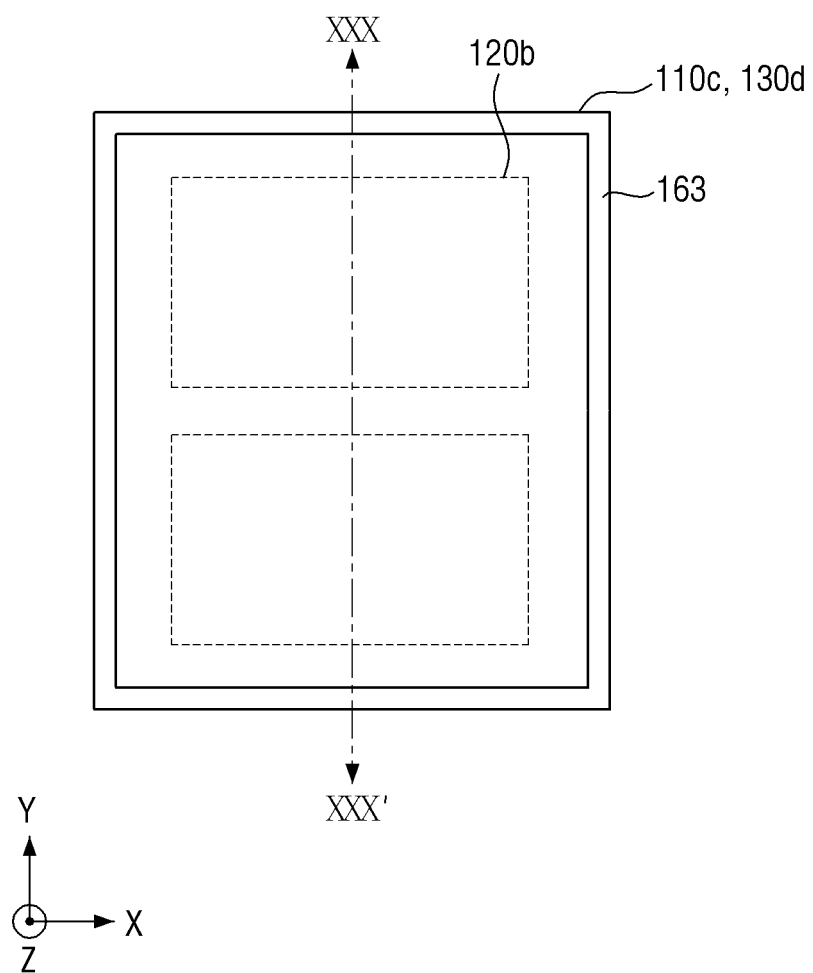
FIG. 29 is an enlarged plan view of one pad terminal according to still another exemplary embodiment.
Figure 30:
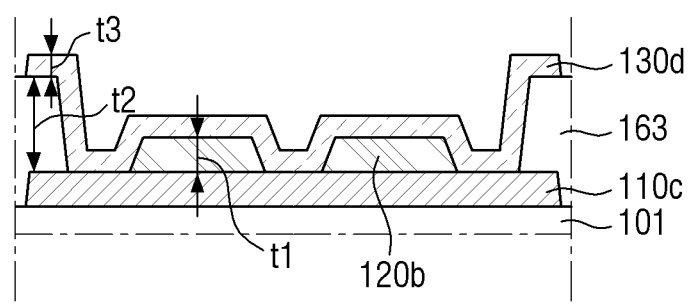
FIG. 30 is a cross-sectional view taken along the line XXX-XXX' in FIG. 29.

FIG. 29 is an enlarged plan view of one pad terminal according to still another exemplary embodiment, and FIG. 30 is a cross-sectional view taken along the line XXX-XXX' in FIG. 29.

Referring to FIGS. 29 and 30, a display device according to this exemplary embodiment is different from the display device according to the exemplary embodiment of FIGS. 5 to 9 in that the third insulating layer 163 has one opening and a plurality of second pad electrodes 120b are arranged in the Y direction.

More specifically, a plurality of second pad electrodes 120b may be arranged on the first pad electrode 110c in the Y direction. Further, the third insulating layer 163 disposed on the first pad electrode 110c may include only one opening exposing the upper surface of the first pad electrode 110c and the upper surface of the second pad electrode 120b. That is, the plurality of second pad electrodes 120b arranged in the Y direction may overlap one opening of the third insulating layer 163.

The third pad electrode 130d may be disposed on the third insulating layer 163 having one opening. Although it is shown in the drawings that the third pad electrode 130d is disposed over the entire third insulating layer 163 in the pad area PA, the present invention is not limited thereto, and the third pad electrode 130d may not overlap a region other than the opening of the third insulating layer 163.

The third pad electrode 130d may be electrically connected to the first pad electrode 110c and the plurality of second conductive electrode 120a arranged in the Y direction through one opening of the third insulating layer 163. That is, the third pad electrode 130d may not be electrically connected to the first pad electrode 110c and the plurality of second pad electrodes 120b arranged in the Y direction over the entire region, but may be connected thereto through one opening obtained by removing a part of the third insulating layer 163.

Even in this case of this exemplary embodiment, a region where the third pad electrode 130d overlaps the second pad electrode 120b may protrude in the thickness direction by the thickness of the second pad electrode 120b as compared with a region where the second pad electrode 120b is not disposed. Accordingly, the upper surface of the third pad electrode 130d in one pad terminal PE includes protrusions. When the upper surface of the third pad electrode 130d includes the protrusions, the pressing stress concentrates on the protrusions, so that uniform bonding can be achieved without deviation according to the position of the pad terminal PE, and bonding reliability of the driving member can be improved.

As described above, according to the exemplary embodiments of the present invention, there can be provided a display device having high bonding reliability.

The effects of the present invention are not limited by the foregoing, and other various effects are anticipated herein.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a display area and a non-display area disposed around the display area,
a substrate; and
at least one pad terminal disposed in the non-display area of the substrate and comprising a first conductive pattern and a second conductive pattern, the second conductive pattern having concave portions and convex portions that are electrically connected to each other to form an uneven surface, wherein
the second conductive pattern is disposed on the first conductive pattern, is electrically connected to the first conductive pattern, and extends outward from a side surface of the first conductive pattern, and wherein:
the pad terminal comprises a first region where the second conductive pattern overlaps the first conductive pattern in a thickness direction and a second region where the second conductive pattern does not overlap the first conductive pattern, and
an upper surface of one of the convex portions of the second conductive pattern in the first region protrudes in the thickness direction as compared with an upper surface of one of the convex portions of the second conductive pattern in the second region.

2. The display device of claim 1,
the upper surface of the one of the convex portions of the second conductive pattern in the first region protrudes substantially by a thickness of the first conductive pattern in the thickness direction as compared with the upper surface of the one of the convex portions of the second conductive pattern in the second region.

3. The display device of claim 2,
wherein the pad terminal further comprises a third conductive pattern disposed under the first conductive pattern.

4. The display device of claim 3,
wherein the third conductive pattern extends outward from the side surface of the first conductive pattern, and the third conductive pattern is in contact with the first conductive pattern in the first region.

5. The display device of claim 4,
wherein the third conductive pattern is in contact with the second conductive pattern in the second region.

6. The display device of claim 1,
wherein
a portion of the upper surface of the second conductive pattern in the first region forms the convex portions, and another portion of the upper surface of the second conductive pattern in the second region forms the concave portions.

7. The display device of claim 6,
wherein the second conductive pattern is in contact with both an upper surface and the side surface of the first conductive pattern.

8. The display device of claim 1,
wherein the first conductive pattern comprises a plurality of first conductive pattern areas, the plurality of first conductive pattern areas are spaced apart from each other, and the second conductive pattern covers the plurality of first conductive pattern areas.

9. The display device of claim 1,
wherein the pad terminal further comprises an insulating pattern disposed on the first conductive pattern and comprising an opening partially exposing the first conductive pattern, and a wherein the second conductive pattern is disposed on the insulating pattern and is in contact with the first conductive pattern through the opening.

10. The display device of claim 9,
the upper surface of the one of the convex portions of the second conductive pattern in the first region protrudes substantially by a thickness of the first conductive pattern in the thickness direction as compared with the upper surface of the one of the convex portions of the second conductive pattern in the second region.

11. The display device of claim 1, further comprising:
a driving member attached to the non-display area of the substrate,
wherein the driving member comprises a bump electrically connected to the pad terminal.

12. The display device of claim 11,
wherein the pad terminal and the bump are in direct contact with each other.

13. The display device of claim 11,
wherein the pad terminal and the bump are ultrasonically bonded to each other.

14. The display device of claim 1, further comprising:
a signal wiring disposed over the non-display area and the display area and connected to the pad terminal.

15. The display device of claim 14,
wherein the display area comprises a plurality of pixels, each of the plurality of pixels comprises at least one thin film transistor, and the signal wiring is electrically connected to the thin film transistor.

16. A display device comprising:
a display area comprising a thin film transistor and a non-display area disposed around the display area;
a pad area having a first region and a second region;
a substrate;
a first conductive layer disposed on the substrate;
a first insulating layer disposed on the first conductive layer;
a second conductive layer disposed on the first insulating layer;
a second insulating layer disposed on the second conductive layer; and
a third conductive layer disposed on the second insulating layer,
wherein the first conductive layer comprises a gate electrode of the thin film transistor of the display area and a first pad electrode disposed in the pad area,
the second conductive layer comprises a second pad electrode disposed in the pad area, and
the third conductive layer comprises source or drain electrodes of the thin film transistor of the display area and a third pad electrode disposed in the pad area,
wherein the first pad electrode, the second pad electrode, and the third pad electrode overlap each other in a thickness direction to be electrically connected to each other, and
the third pad electrode having an uneven surface, and wherein:
the third pad electrode overlaps the second pad electrode in the first region of the pad area in a thickness direction and the third pad electrode does not overlap the second pad electrode in the second region of the pad area, and
an upper surface of a convex portion of the third pad electrode in the first region protrudes in the thickness direction as compared with an upper surface of a convex portion of the third pad electrode in the second region.

17. The display device of claim 16,
wherein the second pad electrode is smaller than the first pad electrode and the third pad electrode.

18. The display device of claim 16, further comprising:
a driving member attached to the non-display area of the substrate,
wherein the driving member comprises a bump being in contact with the uneven surface of the third pad electrode.

19. The display device of claim 18,
wherein the third pad electrode and the bump are ultrasonically bonded to each other.

* * * * *